(12) United States Patent
Hase et al.

(10) Patent No.: US 9,246,444 B2
(45) Date of Patent: Jan. 26, 2016

(54) SEMICONDUCTOR DEVICE

(75) Inventors: Masatoshi Hase, Kanagawa (JP);
Kiichiro Takenaka, Kanagawa (JP);
Hidetoshi Matsumoto, Kanagawa (JP);
Shun Imai, Kanagawa (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 616 days.

(21) Appl. No.: 13/346,925

(22) Filed: Jan. 10, 2012

(65) Prior Publication Data

US 2012/0182086 A1 Jul. 19, 2012

(30) Foreign Application Priority Data

Jan. 14, 2011 (JP) ................. 2011-005646

(51) Int. Cl.
*H03F 1/56* (2006.01)
*H01P 5/12* (2006.01)
*H03F 3/195* (2006.01)
*H03F 3/21* (2006.01)
*H03F 3/24* (2006.01)
*H03H 7/38* (2006.01)
*H03H 7/48* (2006.01)

(52) U.S. Cl.
CPC ............. *H03F 1/565* (2013.01); *H03F 3/195* (2013.01); *H03F 3/211* (2013.01); *H03F 3/245* (2013.01); *H03H 7/38* (2013.01); *H03H 7/48* (2013.01); *H03F 2203/21103* (2013.01); *H03F 2203/21139* (2013.01)

(58) Field of Classification Search
CPC ............. H03F 1/56; H03F 3/602; H03F 3/68; H03F 3/211; H03F 7/48; H01P 5/12

USPC ................ 333/124; 330/124 R, 295
See application file for complete search history.

(56) References Cited

U.S. PATENT DOCUMENTS

| 5,469,129 A * | 11/1995 | Dydyk .................. H03H 7/48 333/100 |
| 5,650,756 A * | 7/1997 | Hayashi ................ 333/100 |
| 5,770,970 A * | 6/1998 | Ikeda et al. ........... 330/286 |
| 5,977,843 A * | 11/1999 | Watanabe ............. 333/127 |
| 6,005,442 A * | 12/1999 | Maeda ................. H03F 3/604 330/295 |
| 6,881,895 B1 * | 4/2005 | Barratt ................ 174/394 |
| 7,084,717 B2 * | 8/2006 | Okazaki et al. ....... 333/118 |
| 7,492,239 B1 * | 2/2009 | Sarkees ............... H03H 7/48 333/100 |
| 7,983,637 B2 * | 7/2011 | Kayano ............... H03F 1/32 333/202 |
| 2010/0225401 A1 | 9/2010 | Hayata et al. |

FOREIGN PATENT DOCUMENTS

JP 2010-206649 A 9/2010

* cited by examiner

*Primary Examiner* — Dean Takaoka
*Assistant Examiner* — Alan Wong
(74) *Attorney, Agent, or Firm* — Mattingly & Malur, PC

(57) ABSTRACT

When a power amplifier mounted in mobile communications equipment, such as a mobile-phone, is composed of a balanced amplifier, technology with which the loss of the electric power composition in a power combiner can be reduced is provided. According to the technical idea of the present embodiment, by dividing an isolation capacitor element into two capacitor elements with high symmetry and coupled in parallel, it is possible to make almost equal parasitic capacitance arising from these capacitor elements, even when the capacitor elements are formed as interlayer capacitor elements of the wiring substrate.

18 Claims, 16 Drawing Sheets

SEMICONDUCTOR DEVICE

CROSS-REFERENCE TO RELATED APPLICATIONS

The disclosure of Japanese Patent Application No. 2011-5646 filed on Jan. 14, 2011 including the specification, drawings, and abstract is incorporated herein by reference in its entirety.

BACKGROUND

The present invention relates to a semiconductor device, especially, to technology which is effective when applied to a semiconductor device employed for mobile communications equipment, such as a mobile-phone.

Patent Literature 1 (Japanese Patent Laid-open No. 2010-206649) describes a configuration of a power amplifier which amplifies a transmit signal. The power amplifier described in Patent Literature 1 is provided with two amplification paths through which transmit signals with a phase difference of 90 degrees with each other are transmitted. That is, the power amplifier described in Patent Literature 1 amplifies the transmit signals with the 90-degree phase difference respectively, and subsequently, combines and outputs an electric power of the transmit signals by a power combiner. Accordingly, the description of Patent Literature 1 is a configuration of the so-called balanced amplifier.

(Patent Literature)
Patent Literature 1: Japanese Patent Laid-open No.

SUMMARY

In recent years, there has been a global spread of mobile communications equipment (for example, a mobile-phone) which employs communications system represented by a GSM (Global System for Mobile Communications) (registered trademark) system, a PCS (Personal Communications Service) system, a PDC (Personal Digital Cellular) system, and a CDMA (Code Division Multiple Access) system, for example. Generally, this kind of mobile communications equipment is configured with an antenna for radiation and reception of a radio wave, an antenna switch for switching transmission and reception by the antenna, a power amplifier (PA module) which amplifies a high-frequency signal of which the electric power is modulated, and supplies it to the antenna, a receive unit for performing signal processing of a high-frequency signal received by the antenna, a controller for controlling these units, and a battery which supplies a power supply voltage to these units.

A power amplifier included in a mobile-phone is configured with a single amplifier with a single amplification path through which a transmit signal is amplified, for example. That is, the single amplifier inputs and amplifies a transmit signal and outputs the amplified transmit signal; in this case, a path through which the transmit signal is inputted, amplified, and outputted is a single path. In the single amplifier, a transmit signal of which the electric power is amplified by the single amplifier is outputted toward an antenna. In the single amplifier, there is a problem that the transmit signal outputted from the single amplifier is susceptible to variation of a load coupled to the single amplifier. That is, through actions such as contacting an antenna to metallic substance or holding an antenna by hand, the load coupled to the output of the single amplifier varies. These load variations bring about change of the load impedance. By this cause, the electric power of the transmit signal outputted from the single amplifier changes.

For example, when the electric power of the transmit signal which is outputted from the single amplifier becomes greater than a specified range due to the variation of the electric power, it will exert an adverse influence on the body of those who use the mobile communications equipment. On the other hand, when the electric power of the transmit signal which is outputted from the single amplifier becomes smaller than the specified range due to the variation of the electric power, transmission of the mobile communications equipment will break off.

Accordingly, for the purpose of reducing influence of the load variation on the electric power of the transmit signal outputted by the power amplifier, the present inventors have studied to configure a power amplifier by employing a balanced amplifier. The balanced amplifier has two amplification paths through which transmit signals with a 90-degree phase difference with each other are transmitted, and combines the transmit signals transmitted through the two amplification paths at the end by a power combiner as a single output. According to the balanced amplifier, since the transmit signals which are transmitted through two amplification paths are shifted 90 degrees with respect to phase, the output from the balanced amplifier can be controlled almost constant, even when there is a variation of the load coupled to the output terminal of the balanced amplifier. This fact is one of advantages of employing the balanced amplifier. That is, in the balanced amplifier, when one amplification path of two amplification paths changes to high impedance due to a load variation, the other amplification path changes to a low impedance due to the load variation. Therefore, when the transmit signals which are transmitted through the two amplification paths are combined, it is possible to complement mutually the change of the electric power of the transmit signals due to the load variation. As a result, the electric power of the transmit signal outputted from the balanced amplifier can be kept almost constant. Therefore, it becomes possible to realize a power amplifier which is robust against load variations, by configuring the power amplifier by employing a balanced amplifier.

Here, the power combiner combines the electric power of the transmit signals which are transmitted respectively through the two amplification paths, after returning the phase difference of the transmit signals from 90 degrees to zero. In this case, when the phase difference of the transmit signals which are inputted into the power combiner from two amplification paths becomes zero exactly, the loss of electric power composition in the power combiner becomes minimum. In this respect, it is desirable that the phase balance of the transmit signals, which are inputted into the power combiner from the two amplification paths, is in good trim. In other words, when the phase balance of the transmit signals which are inputted into the power combiner from the two amplification paths is shifted (or deteriorated), the loss of electric power composition in the power combiner will become great.

The purpose of the present invention is to provide technology which can reduce the loss of electric power composition in a power combiner, when a power amplifier to be mounted in mobile communications equipment, such as a mobile-phone, is configured by employing a balanced amplifier.

The above and other purposes and new features will become clear from description of the specification and the accompanying drawings of the present invention.

The following explains briefly an outline of typical inventions to be disclosed by the present application.

A semiconductor device in a typical embodiment is provided with a negative path and a positive path. The negative path is provided with (a1) a first phase shifter, (b1) a first amplifier coupled to an output of the first phase shifter, and (c1) a second phase shifter coupled to an output of the first amplifier. The positive path is provided with (a2) a third phase shifter, (b2) a second amplifier coupled to an output of the third phase shifter, and (c2) a fourth phase shifter coupled to an output of the second amplifier. The semiconductor device in the typical embodiment is further provided with a power combiner which combines the negative path and the positive path. At this time, the power combiner comprises even number of capacitor elements coupled in parallel between the negative path and the positive path.

The following explains briefly an effect obtained by the typical inventions to be disclosed in the present application.

It is possible to reduce the loss of electric power composition in a power combiner, when a power amplifier to be mounted in mobile communications equipment, such as a mobile-phone, is configured by employing a balanced amplifier.

DETAILED DESCRIPTION

Figure 1:
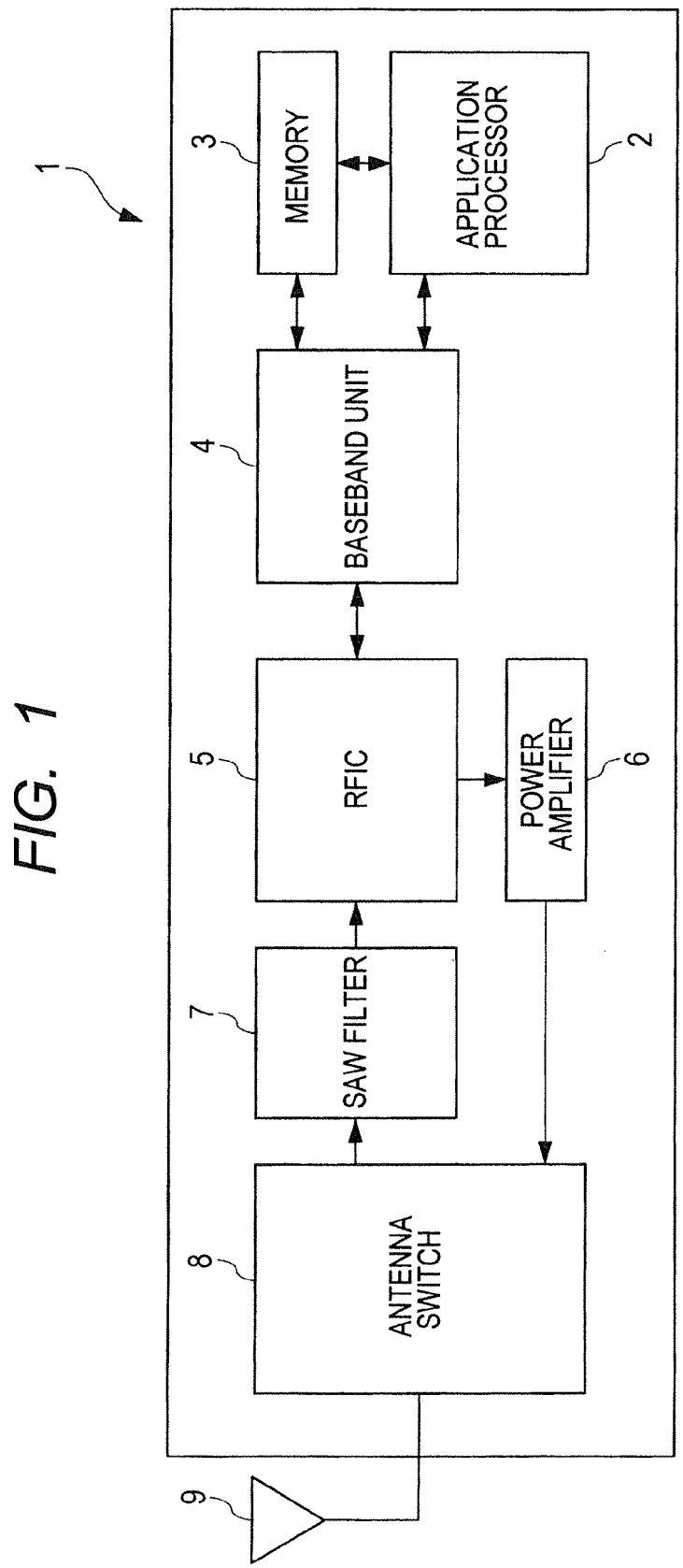
FIG. 1 is a block diagram illustrating a configuration of a transmitter/receiver unit of a mobile-phone.

When necessary for the sake of convenience in the following embodiment, the explanation will be made in divided plural sections or embodiments. However, unless otherwise specified, they are not irrelevant with each other but they have a relationship that one is a modified example, details, and, supplementary explanation of a part or all of the other.

In the following embodiments, when referring to the number of elements, etc. (including the number, a numeric value, quantity, a range, etc.), they shall be not restricted to the specific number but they may be more than or less than the specific number, except for the case where they are explicitly specified or clearly restricted to a specific number in principle.

Furthermore, in the following embodiments, it is needless to say that the components (including an element step etc.) are not necessarily essential, except for the case where they are explicitly specified or they are considered to be essential in principle.

Similarly, in the following embodiments, when referring to the shape, positional relationship, etc. of the components etc., they shall include what is substantially close to or similar to the shape, etc., except for the case where they are explicitly specified or they are considered to be clearly different in principle. This shall be equally applied to the numeric value and the range described above.

In the entire diagrams for explaining the embodiments of the present invention, the same symbol is attached to the same component as a general rule, and the repeated explanation thereof is omitted. Hatching may be attached even to a plan view, in order to make the drawing comprehensible.

Embodiment 1

A Configuration of a Transmitter/Receiver Unit

FIG. 1 is a block diagram illustrating a configuration of a transmitter/receiver unit of a mobile-phone. As illustrated in FIG. 1, the mobile-phone 1 comprises an application processor 2, a memory 3, a baseband unit 4, an RFIC 5, a power amplifier 6, an SAW (Surface Acoustic Wave) filter 7, an antenna switch 8, and an antenna 9.

The application processor 2 comprises a CPU (Central Processing Unit), for example, and possesses function to realize application function of the mobile-phone 1. Specifically, the application processor 2 reads a command from the memory 3, decodes it, and performs various kinds of operations and control based on the decoded result, thereby realizing the application function. The memory 3 possesses function to store data, and stores a program to make the application processor 2 operate and processing data to be used in the application processor 2, for example. The memory 3 can be accessed not only by the application processor 2 but by the baseband unit 4 and stores data to be processed by the baseband unit 4.

The baseband unit 4 comprises a built-in CPU as a central control unit, and performs digital processing of an audio signal (analog signal) from a user (calling party) through an operation unit to generate a baseband signal, at the time of transmission. On the other hand, at the time of reception, the baseband unit 4 generates an audio signal from a baseband signal which is a digital signal.

The RFIC 5 modulates a baseband signal to generate a radio frequency signal at the time of transmission and demodulates a receive signal to generate a baseband signal at the time of reception. The power amplifier 6 is a circuit which newly generates and outputs a signal of a large amount of power analogous to a small input signal, with the use of the electric power supplied from a power supply. The SAW filter 7 passes only signals of a predetermined frequency band out of the receive signal.

The antenna switch 8 separates a receive signal inputted into the mobile-phone 1 and a transmit signal to be outputted from the mobile-phone 1, and the antenna 9 transmits and receives a radio wave.

The mobile-phone 1 is configured as described above. The operation of the mobile-phone 1 is explained briefly in the following. First, the case where a signal is transmitted is explained. A baseband signal generated in the baseband unit 4 by performing the digital processing of an analog signal, such as an audio signal, is inputted into the RFIC 5. In the RFIC 5, the inputted baseband signal is converted into a signal of a radio frequency (RF frequency) by a modulating signal source and a mixer. The signal converted into a radio frequency is outputted to the power amplifier (PA module) 6 from the RFIC 5. The radio frequency signal inputted into the power amplifier 6 is amplified by the power amplifier 6, and transmitted from the antenna 9 via the antenna switch 8.

Next, the case where a signal is received is explained. A signal of a radio frequency received by the antenna 9 (a receive signal) passes the SAW filter 7, and enters the RFIC 5. In the RFIC 5, the inputted receive signal is amplified and undergoes frequency conversion performed by the modulating signal source and the mixer. Then, detection of the frequency-converted signal is performed, to extract a baseband signal. After that, the baseband signal is outputted to the baseband unit 4 from the RFIC 5. This baseband signal is processed by the baseband unit 4, and an audio signal is outputted.

As mentioned above, when transmitting a signal from the digital mobile phone, a signal is amplified by the power amplifier 6, and outputted from the antenna 9 via the antenna switch 8.

<<A Configuration of a PA Module (Single Amplifier)>>

Figure 2:
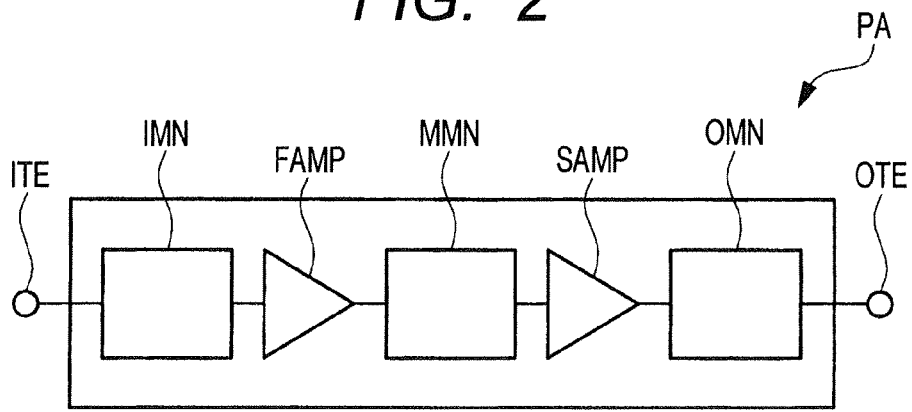
FIG. 2 is a circuit block diagram illustrating an example of a PA module configured by employing a single amplifier.

The following explains the circuit block configuration of the PA module PA (the power amplifier 6 illustrated in FIG. 1). FIG. 2 is a circuit block diagram illustrating an example of a PA module PA configured by employing a single amplifier. A single amplifier shall mean a PA module PA of which the path for amplifying a transmit signal is made of a single path. As illustrated in FIG. 2, the PA module PA comprises an input matching circuit IMN, a first stage amplifier circuit FAMP, an interstage matching circuit MMN, a last stage amplifier circuit SAMP, and an output matching circuit OMN, between an input terminal ITE and an output terminal OTE.

The input matching circuit IMN is a circuit for outputting efficiently an input signal (transmit signal) inputted from the input terminal ITE, to the first stage amplifier circuit FAMP. Specifically, the input matching circuit IMN comprises passive components, such as a capacitor element and an inductor element, and they are combined together so that impedance matching for the input signal can be achieved.

The first stage amplifier circuit FAMP amplifies the electric power of the transmit signal outputted from the input matching circuit IMN. For example, the first stage amplifier circuit FAMP employs a compound semiconductor device, such as an HBT and an HEMT, a silicon bipolar transistor, an LDMOSFET (Laterally Diffused Metal Oxide Semiconductor Field Effect Transistor), etc., corresponding to the purpose or the circumstances.

The interstage matching circuit MMN transmits efficiently the transmit signal amplified by the first stage amplifier circuit FAMP, to the last stage amplifier circuit SAMP. Specifically, the interstage matching circuit MMN comprises passive components, such as a capacitor element and an inductor element, and they are combined together so that impedance matching for the transmit signal can be achieved.

The last stage amplifier circuit SAMP amplifies the electric power of the transmit signal outputted from the interstage matching circuit MMN. For example, the last stage amplifier circuits SAMP employs, as is the case with the first stage amplifier circuit FAMP, a compound semiconductor device, such as an HBT and an HEMT, a silicon bipolar transistor, an LDMOSFET (Laterally Diffused Metal Oxide Semiconductor Field Effect Transistor), etc., corresponding to the purpose or the circumstances.

The output matching circuit OMN outputs efficiently the transmit signal amplified by the last stage amplifier circuit SAMP, from the output terminal OTE. Specifically, the output matching circuit OMN comprises passive components, such as a capacitor element and an inductor element, and they are combined together so that impedance matching for the transmit signal can be achieved.

The PA module PA which comprises a single amplifier is configured as described above. The following explains the operation of the PA module PA, referring to FIG. 2. First, when a transmit signal is inputted into the input terminal ITE, the transmit signal enters the input matching circuit IMN through the input terminal ITE. Since this input matching circuit IMN is configured so that impedance matching may be achieved to the transmit signal, the transmit signal inputted into the input matching circuit IMN reflects scarcely and is efficiently outputted from the input matching circuit IMN.

Next, the transmit signal outputted from the input matching circuit IMN is inputted into the first stage amplifier circuit FAMP. The electric power of the transmit signal is amplified in the first stage amplifier circuit FAMP. The transmit signal amplified by the first stage amplifier circuit FAMP is inputted into the interstage matching circuit MMN. Since the impedance matching is achieved to the transmit signal in the interstage matching circuit MMN as well at this time, the transmit signal is efficiently outputted from the interstage matching circuit MMN.

After that, the transmit signal outputted from the interstage matching circuit MMN is inputted into the last stage amplifier circuit SAMP. The electric power of the transmit signal is amplified in the last stage amplifier circuit SAMP. The transmit signal amplified by the last stage amplifier circuit SAMP is inputted into the output matching circuit OMN. Since the impedance matching is achieved to the transmit signal in the output matching circuit OMN as well, the transmit signal is efficiently outputted from the output matching circuit OMN. The transmit signal outputted from the output matching circuit OMN is outputted to the exterior of the PA module PA via the output terminal OTE. The electric power of the transmit signal can be amplified by the PA module PA as described above.

In the PA module PA configured as described above, the transmit signal of which the electric power has been amplified by the PA module PA is outputted toward the antenna. When the PA module PA is configured by employing a single amplifier at this time, there is a problem that the transmit signal outputted from the single amplifier is susceptible to variation of a load coupled to the single amplifier. For example, when the electric power of the transmit signal which is outputted from the single amplifier becomes greater than a specified range due to the variation of the electric power, it will exert an adverse influence on the body of those who use the mobile communications equipment. On the other hand, when the electric power of the transmit signal which is outputted from the single amplifier becomes smaller than the specified range due to the variation of the electric power, transmission of the mobile communications equipment will break off.

<<A Configuration of a PA Module (Balanced Amplifier)>>

Accordingly, for the purpose of reducing influence of the load variation on the electric power of the transmit signal outputted by the PA module PA, it has been studied to configure the PA module PA by employing a balanced amplifier. The balanced amplifier has two amplification paths through which transmit signals with a 90-degree phase difference with each other are transmitted, and combines the transmit signals transmitted through the two amplification paths at the end by a power combiner as a single output.

Figure 3:
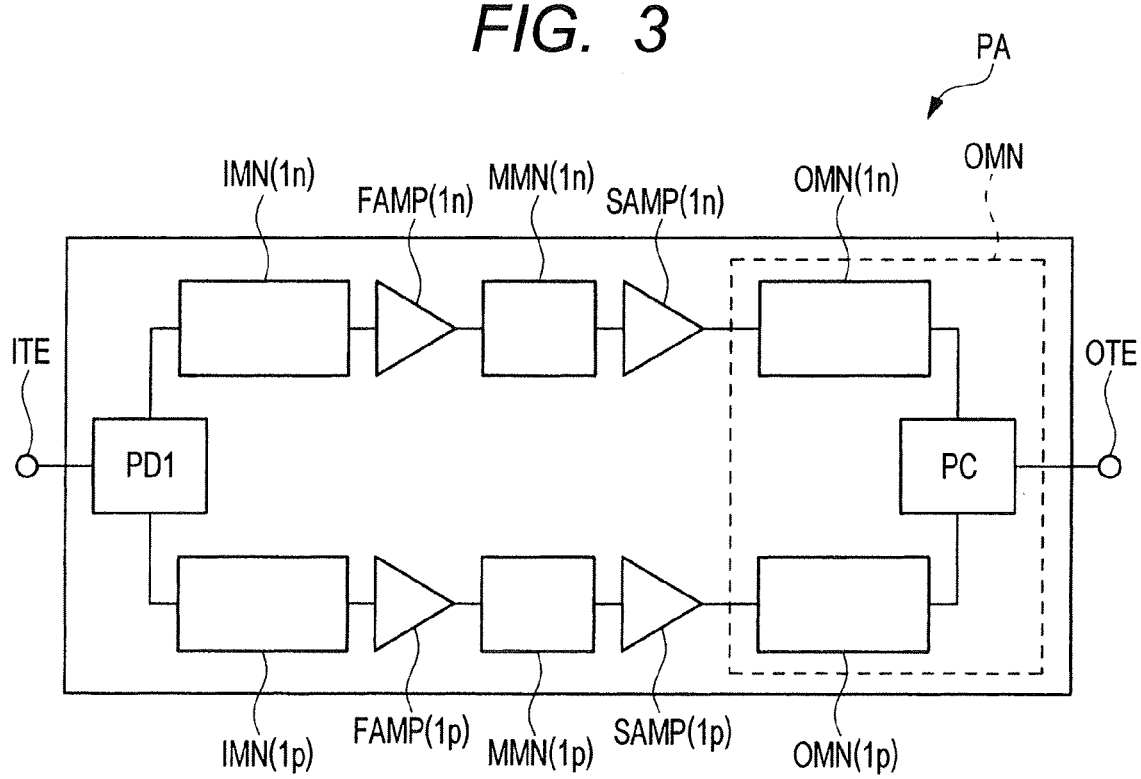
FIG. 3 is a circuit block diagram illustrating an example of a PA module configured by employing a balanced amplifier.

FIG. 3 is a circuit block diagram illustrating an example of a PA module PA configured by employing a balanced amplifier. In the balanced amplifier illustrated in FIG. 3, there exist two amplification paths between the input terminal ITE and the output terminal OTE. Among the two amplification paths, one amplification path will be called a negative path, and the other amplification path will be called a positive path. The negative path and the positive path are branched by a power divider PD1 coupled to the same input terminal ITE.

First, a configuration of the negative path is explained. The negative path comprises an input matching circuit IMN($1n$), a first stage amplifier circuit FAMP($1n$), an interstage matching circuit MMN($1n$), a last stage amplifier circuit SAMP($1n$), and an output matching circuit OMN($1n$), between the power divider PD1 and a power combiner PC.

The input matching circuit IMN($1n$) (phase shifter) is a circuit for outputting efficiently an input signal (transmit signal) divided by the power divider PD1, to the first stage amplifier circuit FAMP($1n$). Specifically, the input matching circuit IMN($1n$) comprises passive components, such as a capacitor element and an inductor element, and they are combined together so that impedance matching for the input signal can be achieved. The present input matching circuit IMN($1n$) possesses a function to achieve impedance matching and a function to adjust the phase of the transmit signal transmitted through the input matching circuit IMN($1n$). That is, in the balanced amplifier, the transmit signals which are transmitted through the negative path and the positive path are designed to have phase which is different 90 degrees with each other, therefore, the phase of the transmit signal to be transmitted through the negative path is adjusted first in the input matching circuit IMN($1n$) into which the transmit signal divided by the power divider PD1 is inputted.

The first stage amplifier circuit FAMP($1n$) amplifies the electric power of the transmit signal outputted from the input matching circuit IMN($1n$). For example, the first stage amplifier circuit FAMP($1n$) employs a compound semiconductor device, such as an HBT and an HEMT, a silicon bipolar transistor, an LDMOSFET (Laterally Diffused Metal Oxide Semiconductor Field Effect Transistor), etc., corresponding to the purpose or the circumstances.

The interstage matching circuit MMN(in) transmits efficiently the transmit signal amplified by the first stage amplifier circuit FAMP($1n$), to the last stage amplifier circuit SAMP($1n$). Specifically, the interstage matching circuit MMN($1n$) comprises passive components, such as a capacitor element and an inductor element, and they are combined together so that impedance matching for the transmit signal can be achieved.

The last stage amplifier circuit SAMP($1n$) amplifies the electric power of the transmit signal outputted from the interstage matching circuit MMN($1n$). For example, the last stage amplifier circuit SAMP($1n$) employs, as is the case with the first stage amplifier circuit FAMP($1n$), a compound semiconductor device, such as an HBT and an HEMT, a silicon bipolar transistor, an LDMOSFET (Laterally Diffused Metal Oxide Semiconductor Field Effect Transistor), etc., corresponding to the purpose or the circumstances.

The output matching circuit OMN($1n$) (phase shifter) outputs efficiently the transmit signal amplified by the last stage amplifier circuit SAMP($1n$), from the output terminal OTE. Specifically, the output matching circuit OMN($1n$) comprises passive components, such as a capacitor element and an inductor element, and they are combined together so that impedance matching for the transmit signal can be achieved. In the balanced amplifier, the output matching circuit OMN ($1n$) possesses a function to achieve impedance matching and a function to adjust the phase of the transmit signal transmitted through the negative path. That is, in the balanced amplifier, the phase of the transmit signals transmitted through the negative path and the positive path is adjusted so as to be shifted 90 degrees, and the power combiner PC combines finally the transmit signal transmitted through the negative path and the transmit signal transmitted through the positive path. Therefore, the balanced amplifier is configured so that the phase of the transmit signals may be adjusted in the output matching circuit OMN($1n$) just before the transmit signals are inputted into the power combiner PC.

Next, a configuration of the positive path is explained. The positive path comprises an input matching circuit IMN($1p$), a first stage amplifier circuit FAMP($1p$), an interstage matching circuit MMN($1p$), a last stage amplifier circuit SAMP($1p$), and an output matching circuit OMN($1p$), between the power divider PD1 and the power combiner PC.

The input matching circuit IMN($1p$) (phase shifter) is a circuit for outputting efficiently an input signal (transmit signal) divided by the power divider PD1, to the first stage amplifier circuit FAMP($1p$). Specifically, the input matching circuit IMN($1p$) comprises passive components, such as a capacitor element and an inductor element, and they are combined together so that impedance matching for the input signal can be achieved. The present input matching circuit IMN ($1p$) possesses a function to achieve impedance matching and a function to adjust the phase of the transmit signal transmitted through the input matching circuit IMN($1p$). That is, in the balanced amplifier, the transmit signals which are transmitted through the negative path and the positive path are designed to have phase which is different 90 degrees with each other, therefore, the phase of the transmit signal to be transmitted through the positive path is adjusted first in the input matching circuit IMN(1p) into which the transmit signal divided by the power divider PD1 is inputted.

The first stage amplifier circuit FAMP(1p) amplifies the electric power of the transmit signal outputted from the input matching circuit IMN(1p). For example, the first stage amplifier circuit FAMP(1p) employs a compound semiconductor device, such as an HBT and an HEMT, a silicon bipolar transistor, an LDMOSFET (Laterally Diffused Metal Oxide Semiconductor Field Effect Transistor), etc., corresponding to the purpose or the circumstances.

The interstage matching circuit MMN(1p) transmits efficiently the transmit signal amplified by the first stage amplifier circuit FAMP(1p), to the last stage amplifier circuit SAMP(1p). Specifically, the Interstage matching circuit MMN(1p) comprises passive components, such as a capacitor element and an inductor element, and they are combined together so that impedance matching for the transmit signal can be achieved.

The last stage amplifier circuit SAMP(1p) amplifies the electric power of the transmit signal outputted from the interstage matching circuit MMN(1p). For example, the last stage amplifier circuit SAMP(1p) employs, as is the case with the first stage amplifier circuit FAMP(1p), a compound semiconductor device, such as an HBT and an HEMT, a silicon bipolar transistor, an LDMOSFET (Laterally Diffused Metal Oxide Semiconductor Field Effect Transistor), etc., corresponding to the purpose or the circumstances.

The output matching circuit OMN(1p) (phase shifter) outputs efficiently the transmit signal amplified by the last stage amplifier circuit SAMP(1p), from the output terminal OTE. Specifically, the output matching circuit OMN(1p) comprises passive components, such as a capacitor element and an inductor element, and they are combined together so that impedance matching for the transmit signal can be achieved. In the balanced amplifier, the output matching circuit OMN(1p) possesses a function to achieve impedance matching and a function to adjust the phase of the transmit signal transmitted through the positive path. That is, in the balanced amplifier, the phase of the transmit signals transmitted through the negative path and the positive path is adjusted so as to be shifted 90 degrees, and the power combiner PC combines finally the transmit signal transmitted through the negative path and the transmit signal transmitted through the positive path. Therefore, the balanced amplifier is configured so that the phase of the transmit signals may be adjusted in the output matching circuit OMN(1p) just before the transmit signals are inputted into the power combiner PC.

In FIG. 3, the output matching circuit OMN is configured with the output matching circuit OMN(1n) of the negative path, the output matching circuit OMN(1p) of the positive path, and the Power combiner PC.

As described above, there exist two amplification paths of the negative path and the positive path in the balanced amplifier. However, the feature of the balanced amplifier lies in the fact that the phase of the transmit signal transmitted through the positive path and the phase of the transmit signal transmitted through the negative path are shifted by 90 degrees. That is, as illustrated in FIG. 3, first, the phase of the transmit signal outputted to the negative path and the phase of the transmit signal outputted to the positive path, both outputted from the power divider PD1 through the input terminal ITE, are the same. Next, the phase of the transmit signals is adjusted in the input matching circuit IMN(1n) of the negative path and the input matching circuit IMN(1p) of the positive path. As the result, the phase difference of 90 degrees is produced between the phase of the transmit signal outputted from the input matching circuit IMN(1n) of the negative path and the phase of the transmit signal outputted from the input matching circuit IMN(1p) of the positive path. In the state with the phase difference of 90 degrees, the transmit signals are transmitted, respectively, through the first stage amplifier circuit FAMP(1n), the interstage matching circuit MMN(1n), and the last stage amplifier circuit SAMP(1n) of the negative path, and through the first stage amplifier circuit FAMP(1p), the interstage matching circuit MMN(1p), and the last stage amplifier circuit SAMP(1p) of the positive path. Then, the phase of each transmit signal is adjusted in the output matching circuit OMN(1n) of the negative path and in the output matching circuit OMN(1p) of the positive path; as the result, the phase of the transmit signal outputted from the output matching circuit OMN(1n) of the negative path and the phase of the transmit signal outputted from the output matching circuit OMN(1p) of the positive path become the same. Subsequently, the transmit signals which have become the same in phase are combined by the power combiner PC.

According to the balanced amplifier, since the transmit signals which are transmitted through two amplification paths are shifted 90 degrees with respect to phase, the output from the balanced amplifier can be controlled almost constant, even when there is a variation of the load coupled to the output terminal of the balanced amplifier. This fact is one of advantages of employing the balanced amplifier. That is, when one amplification path of two amplification paths changes to high impedance due to a load variation, the other amplification path changes to a low impedance due to the load variation. Therefore, when the transmit signals which are transmitted through the two amplification paths are combined, it is possible to complement mutually the change of the electric power of the transmit signals due to the load variation. As a result, the electric power of the transmit signal outputted from the balanced amplifier can be kept almost constant. Therefore, it becomes possible to realize the PA module PA which is robust against load variations, by configuring the PA module PA by employing a balanced amplifier.

A configuration of the balanced amplifier which can simplify the internal configuration of the RFIC is explained.

Figure 4:
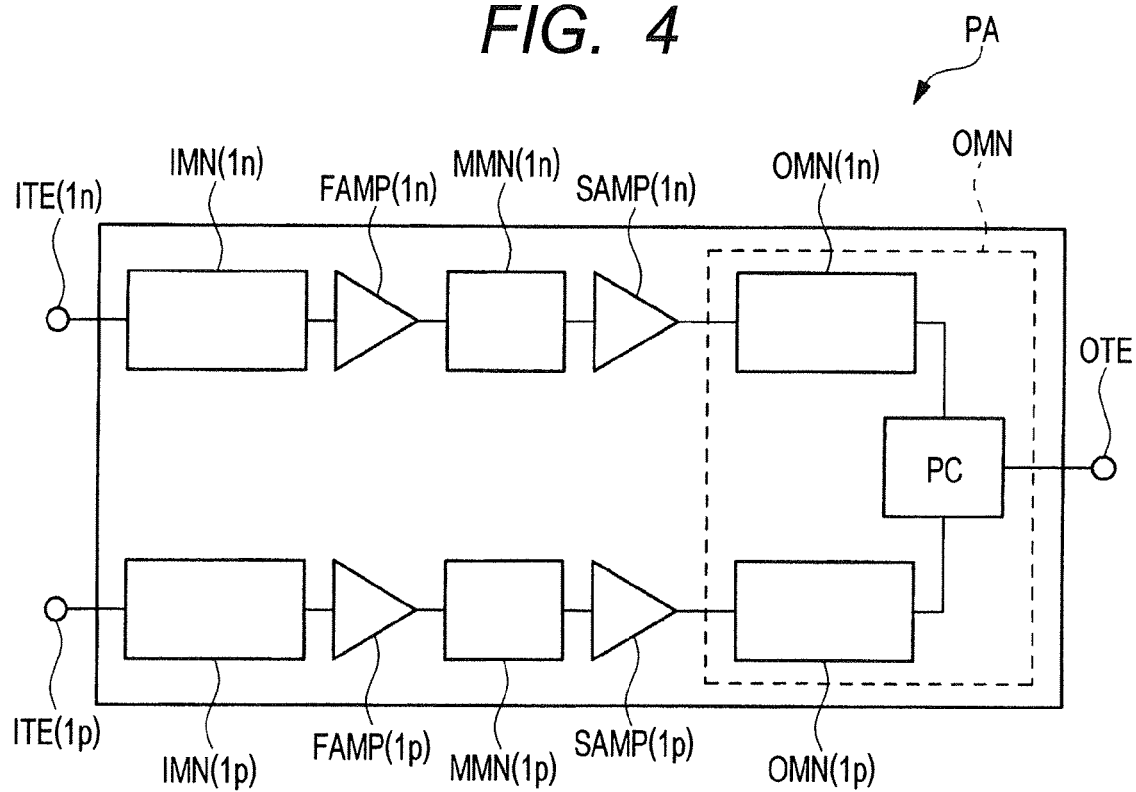
FIG. 4 is a circuit block diagram illustrating an example of a PA module configured by employing a balanced amplifier.

FIG. 4 is a circuit block diagram illustrating an example of a PA module PA configured by employing a balanced amplifier. The balanced amplifier illustrated in FIG. 4 comprises an input terminal ITE(1n) and an input terminal ITE(1p). That is, the balanced amplifier illustrated in FIG. 4 is different from the balanced amplifier illustrated in FIG. 3 in a point that, in contrast to the balanced amplifier illustrated in FIG. 3 which inputs a transmit signal from one input terminal ITE, the balanced amplifier illustrated in FIG. 4 inputs differential signals of which the phases are different 180 degrees with each other from the two input terminals ITE (1n) and ITE (1p), as a transmit signal. The other configurations of the balanced amplifier illustrated in FIG. 3 and the balanced amplifier illustrated in FIG. 4 are almost the same.

In the case of the balanced amplifier illustrated in FIG. 3, the transmit signal is inputted from one input terminal ITE, and the transmit signal inputted is divided inside the PA module PA by use of the power divider PD1, into a transmit signal to be transmitted through the negative path and a transmit signal to be transmitted through the positive path.

In this case, it is common to configure a mixer inside the RFIC, to which a transmit signal to the PA module PA is inputted, by employing a differential circuit with two output terminals which outputs differential signals with the phase difference of 180 degrees with each other. Therefore, in the case of the balanced amplifier illustrated in FIG. 3, it is necessary to provide inside the RFIC a circuit which converts the differential signals into a single-ended signal. Accordingly, in the present case, the transmit signal is inputted into the PA module PA after converted into a single-ended signal from the differential signals inside the RFIC, and the transmit signal is again divided by the power divider PD1 inside the PA module PA. Accordingly, the circuit configuration is redundant.

On the other hand, in the case of the balanced amplifier illustrated in FIG. 4, the input terminal ITE (1n) leading to the negative path and the input terminal ITE(1p) leading to the positive path are separate, and the transmit signal inputted into the input terminal ITE(1n) and the transmit signal inputted into the input terminal ITE(1p) configure a differential input with the phase difference of 180 degrees. Accordingly, a circuit for converting the differential signals into a single-ended signal inside the RFIC, and the power divider PD1 inside the PA module PA become unnecessary, thereby eliminating the redundancy of the circuit configuration. This fact means that the balanced amplifier illustrated in FIG. 4 possesses the properties whose power consumption decreases, because efficient transmission of a transmit signal is attained as a result of elimination of transmission loss due to the two circuits which have become unnecessary.

Accordingly, in the present embodiment 1, an example to configure the PA module PA by employing the balanced amplifier illustrated in FIG. 4 is explained. However, the technical idea of the present embodiment 1 is not restricted to the balanced amplifier illustrated in FIG. 4, and can be applied also to the balanced amplifier illustrated in FIG. 3, for example.

<<Operation of a PA Module (Balanced Amplifier)>>

The PA module PA which comprises a balanced amplifier is configured as described above. The following explains the operation of the PA module PA, referring to FIGS. 5 and 6.

Figure 5:
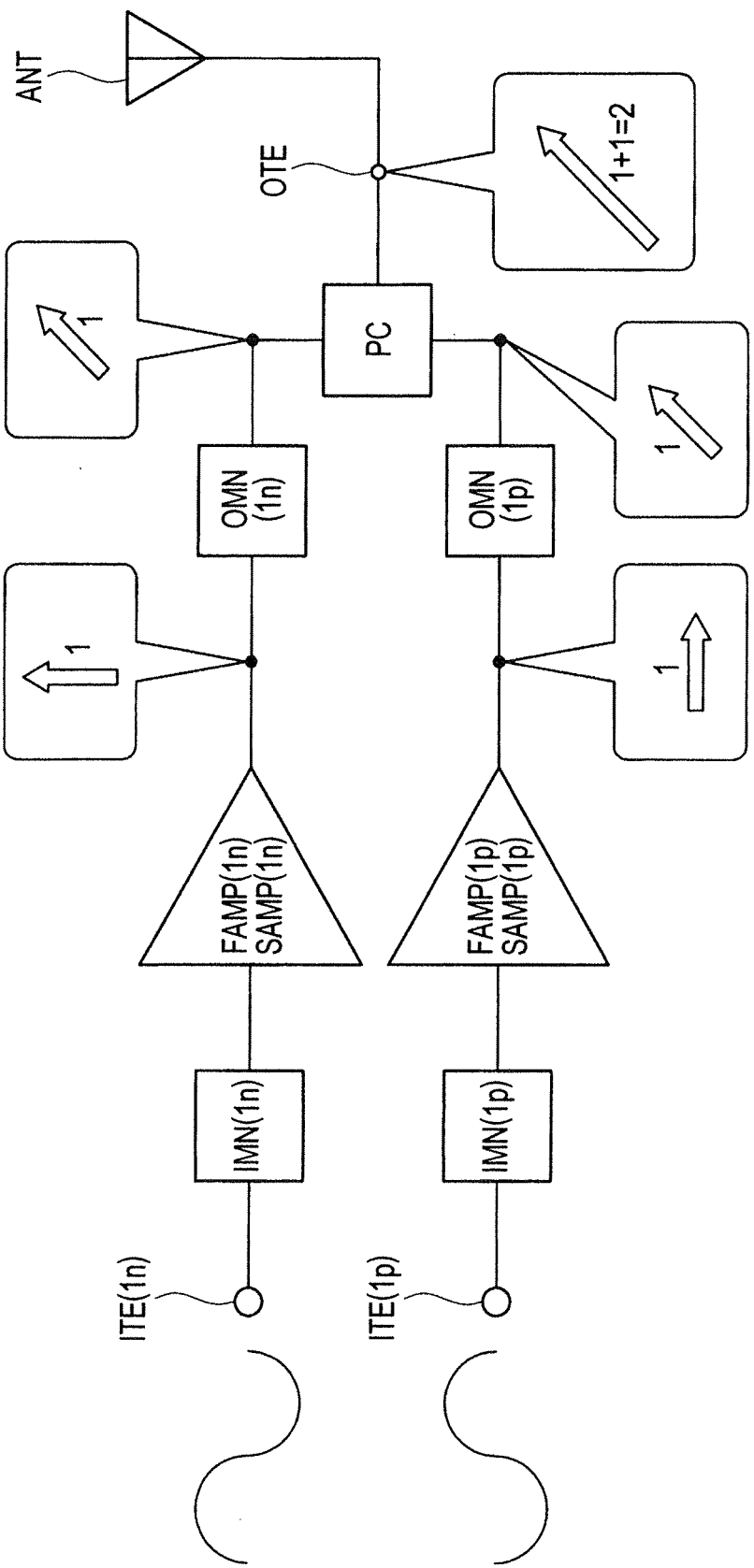
FIG. 5 is a drawing explaining operation of a balanced amplifier.

First, referring to FIG. 5, the operation of the balanced amplifier when the load variation is not generated is explained. As illustrated in FIG. 5, in the negative path, the transmit signal which is inputted from the input terminal ITE (1n) undergoes phase adjustment to 90 degrees for example in the input matching circuit IMN(1n), and then, the transmit signal is amplified in the first stage amplifier circuit FAMP (1n) and the last stage amplifier circuit SAMP(1n). The amplified transmit signal undergoes phase adjustment in the output matching circuit OMN(1n). The phase of the transmit signal outputted from the output matching circuit OMN(1n) is 45 degrees, for example.

On the other hand, in the positive path, the transmit signal with a phase shifting 180 degrees from the transmit signal inputted into the negative path is inputted into the input terminal ITE(1p). The transmit signal inputted from the input terminal ITE(1p) undergoes phase adjustment to 0 degree for example in the input matching circuit IMN(1p), and then the transmit signal is amplified by the first stage amplifier circuit FAMP(1p) and the last stage amplifier circuit SAMP(1p). The amplified transmit signal undergoes phase adjustment in the output matching circuit OMN(1p). The phase of the transmit signal outputted from the output matching circuit OMN(1p) is 45 degrees, for example.

Subsequently, the transmit signal outputted from the output matching circuit OMN(1n) of the negative path and the transmit signal outputted from the output matching circuit OMN(1p) of the positive path are combined by the power combiner PC and outputted from the output terminal OTE. The transmit signal outputted from the output terminal OTE is transmitted from the antenna ANT.

Here, the following explains the relation between the phase of the transmit signal which is transmitted through the negative path, and the phase of the transmit signal which is transmitted through the positive path. As illustrated in FIG. 5, first, the difference of the phase of the transmit signal before inputted into the input matching circuit IMN(1n) of the negative path, and the phase of the transmit signal before inputted into the input matching circuit IMN(1p) of the positive path is 180 degrees.

Next, in the negative path, the phase of the transmit signal after outputted from the input matching circuit IMN(1n) is 90 degrees. The phase and the magnitude of amplitude of the transmit signal at this time are given respectively by the direction of 90 degrees and the magnitude of "1" for example, as illustrated in FIG. 5. On the other hand, in the positive path, the phase of the transmit signal after outputted from the input matching circuit IMN(1p) is 0 degree. The phase and the magnitude of amplitude of the transmit signal at this time are given respectively by the direction of 0 degree and the magnitude of "1" for example, as illustrated in FIG. 5. Accordingly, the difference of the phase (90 degrees) of the transmit signal outputted from the input matching circuit IMN(1n) in the negative path and the phase (0 degree) of the transmit signal outputted from the input matching circuit IMN(1p) in the positive path is 90 degrees.

Next, in the negative path, the phase of the transmit signal after outputted from the output matching circuit OMN(1n) is 45 degrees. The phase and the magnitude of amplitude of the transmit signal at this time are given respectively by the direction of 45 degrees and the magnitude of "1" for example, as illustrated in FIG. 5. On the other hand, in the positive path, the phase of the transmit signal after outputted from the output matching circuit OMN(1p) is 45 degrees. The phase and the magnitude of amplitude of the transmit signal at this time are given respectively by the direction of 45 degrees and the magnitude of "1" for example, as illustrated in FIG. 5. Accordingly, the difference of the phase (45 degrees) of the transmit signal outputted from the output matching circuit OMN(1n) in the negative path and the phase (45 degrees) of the transmit signal outputted from the output matching circuit OMN(1p) in the positive path is 0 degree.

In this way, the transmit signal outputted from the output matching circuit OMN(1n) of the negative path and the transmit signal outputted from the output matching circuit OMN (1p) of the positive path have the phase of same 45 degrees. Therefore, when the transmit signal of the negative path and the transmit signal of the positive path are combined by the power combiner PC, the phase of the transmit signal outputted to the output terminal OTE from the power combiner PC is 45 degrees, and the magnitude of amplitude is given by "1"+"1"="2." This transmit signal is transmitted from the antenna ANT. The above is the operation of the balanced amplifier when the load variation is not generated.

Figure 6:
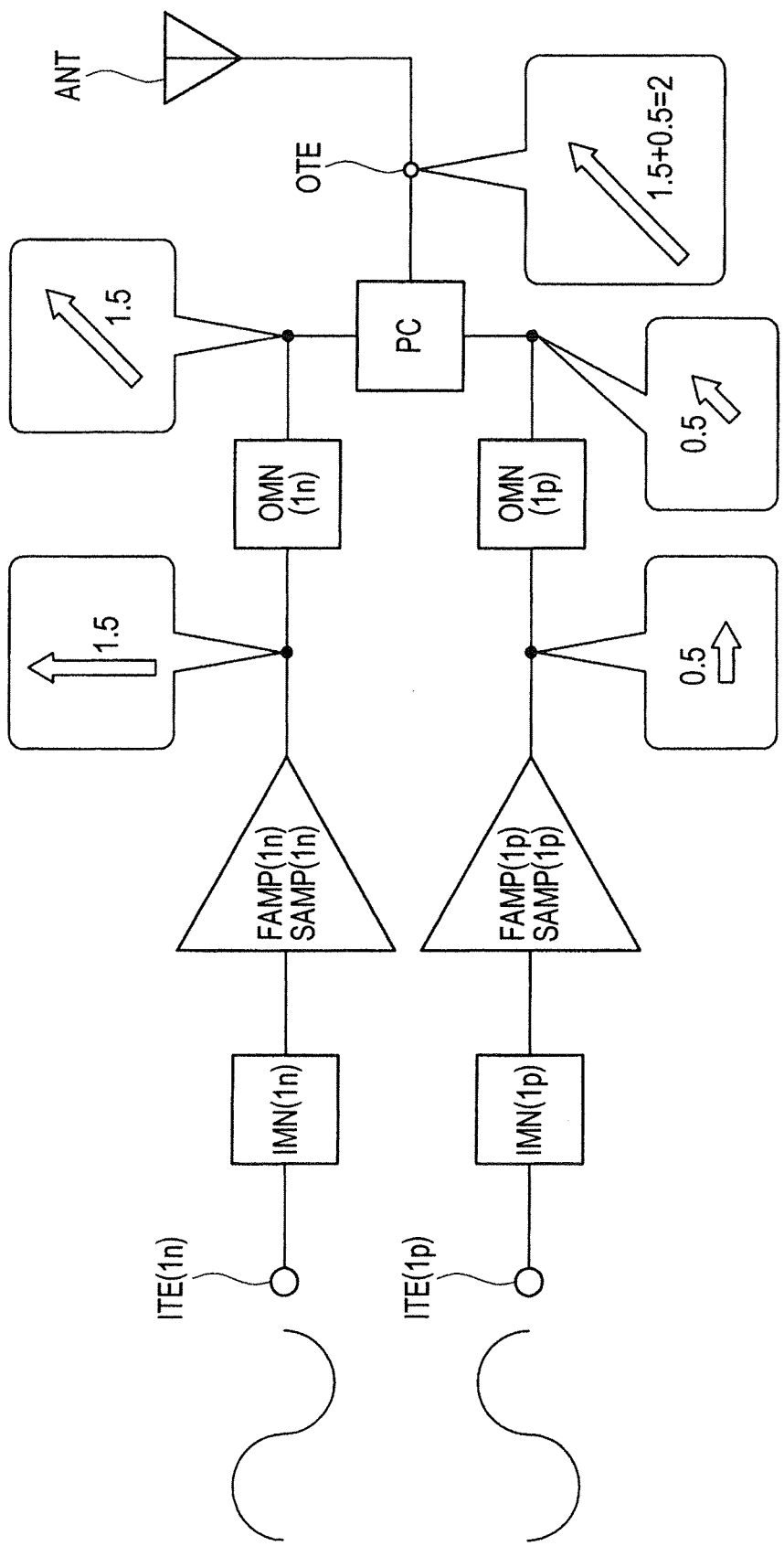
FIG. 6 is a drawing explaining operation of a balanced amplifier.

Next, referring to FIG. 6, the operation of the balanced amplifier when the load variation is generated is explained. As illustrated in FIG. 6, in the negative path, the transmit signal which is inputted from the input terminal ITE(1n) undergoes phase adjustment to 90 degrees for example in the input matching circuit IMN(1n), and then, the transmit signal is amplified in the first stage amplifier circuit FAMP(1n) and the last stage amplifier circuit SAMP(1n). The amplified transmit signal undergoes phase adjustment in the output matching circuit OMN(1n). The phase of the transmit signal outputted from the output matching circuit OMN(1n) is 45 degrees, for example.

On the other hand, in the positive path, the transmit signal with a phase shifting 180 degrees from the transmit signal inputted into the negative path is inputted into the input terminal ITE(1p). The transmit signal inputted from the input terminal ITE(1p) undergoes phase adjustment to 0 degree for example in the input matching circuit IMN(1p), and then the transmit signal is amplified by the first stage amplifier circuit FAMP(1p) and the last stage amplifier circuit SAMP(1p). The amplified transmit signal undergoes phase adjustment in the output matching circuit OMN(1p). The phase of the transmit signal outputted from the output matching circuit OMN(1p) is 45 degrees, for example.

Subsequently, the transmit signal outputted from the output matching circuit OMN(1n) of the negative path and the transmit signal outputted from the output matching circuit OMN(1p) of the positive path are combined by the power combiner PC and outputted from the output terminal OTE. The transmit signal outputted from the output terminal OTE is transmitted from the antenna ANT.

Here, the following explains the relation between the phase and the magnitude of amplitude of the transmit signal which is transmitted through the negative path, and the phase and the magnitude of amplitude of the transmit signal which is transmitted through the positive path. As illustrated in FIG. 6, first, the difference of the phase of the transmit signal before inputted into the input matching circuit IMN(1n) of the negative path, and the phase of the transmit signal before inputted into the input matching circuit IMN(1p) of the positive path is 180 degrees.

Next, in the negative path, the phase of the transmit signal after outputted from the input matching circuit IMN(1n) is 90 degrees. The phase and the magnitude of amplitude of the transmit signal at this time are given respectively by the direction of 90 degrees and the magnitude of "1.5" for example, as illustrated in FIG. 6. In this way, when a load variation occurs, the amplitude of the transmit signal which is transmitted through the negative path changes from "1" to "1.5", for example.

On the other hand, in the positive path, the phase of the transmit signal after outputted from the input matching circuit IMN(1p) is 0 degree. The phase and the magnitude of amplitude of the transmit signal at this time are given respectively by the direction of 0 degree and the magnitude of amplitude of "0.5", as illustrated in FIG. 6. In this way, when a load variation occurs, the amplitude of the transmit signal which is transmitted through the positive path changes from "1" to "0.5", for example. This is because two amplification paths (the negative path and the positive path) are designed so as to complement the change of the output power mutually against the load variation.

Next, in the negative path, the phase of the transmit signal after outputted from the output matching circuit OMN(1n) is 45 degrees. The phase and the magnitude of amplitude of the transmit signal at this time are given respectively by the direction of 45 degrees and the magnitude of "1.5" for example, as illustrated in FIG. 6. On the other hand, in the positive path, the phase of the transmit signal after outputted from the output matching circuit OMN(1p) is 45 degrees. The phase and the magnitude of amplitude of the transmit signal at this time are given respectively by the direction of 45 degrees and the magnitude of amplitude of "0.5", as illustrated in FIG. 6. Accordingly, the difference of the phase (45 degrees) of the transmit signal outputted from the output matching circuit OMN(1n) in the negative path and the phase (45 degrees) of the transmit signal outputted from the output matching circuit OMN(1p) in the positive path is 0 degree.

In this way, the transmit signal outputted from the output matching circuit OMN(1n) of the negative path and the transmit signal outputted from the output matching circuit OMN(1p) of the positive path have the phase of same 45 degrees. Therefore, when the transmit signal of the negative path and the transmit signal of the positive path are combined by the power combiner PC, the phase of the transmit signal outputted to the output terminal OTE from the power combiner PC is 45 degrees, and the magnitude of amplitude is given by "1.5"+"0.5"="2." This transmit signal is transmitted from the antenna ANT. Accordingly, even when a load variation is generated, the magnitude of amplitude of the transmit signal transmitted from the antenna ANT becomes "2." That is, the magnitude of amplitude of the transmit signal transmitted from the antenna ANT before and after a load variation is generated does not change. This fact means that, in the balanced amplifier, the electric power of the transmit signal transmitted can be kept constant, even when a load variation is generated. Therefore, it is seen that it is possible to realize the PA module PA which is robust against load variations, by configuring the PA module PA by employing a balanced amplifier.

<<Realization of Dual Bands of a PA Module (Balanced Amplifier)>>

In the recent years' mobile-phone, not only a voice call function but various application functions are added. That is, functions other than the voice call function, such as viewing and listening of distribution music, video transmission, and data transfer, using a mobile-phone are added to the mobile-phone. Accompanying such a movement toward multifunction of a mobile-phone, there exist in various countries in the world many kinds of frequency zones (a GSM (Global System for Mobile communications) zone, a PCS (Personal Communications Service) zone, etc.) and many kinds of modulation methods (GSM, EDGE (Enhanced Data rates for GSM Evolution), WCDMA (Wideband Code Division Multiple Access), etc.). Accordingly, it is necessary for a mobile-phone to support the transmission and reception signals corresponding to plural different frequency zones and different modulation methods. From these circumstances, a PA module PA employed in a mobile-phone is also demanded to possess a function for amplifying signals of respectively different frequency zones; accordingly, a configuration is adopted in which it is possible to amplify a transmit signal of a different frequency band in one semiconductor chip in which a PA module PA is configured. That is, considering the case where the transmit signals of two different frequency bands (hereinafter, called as a low-band signal (a signal of a first frequency band) and a high-band signal (a signal of a second frequency band)) are amplified for example, an amplifier circuit for the low-band signals and an amplifier circuit for high-band signals will be formed in one semiconductor chip. This fact means that when a PA module PA is configured by employing a balanced amplifier, a balanced amplifier for low band signals and a balanced amplifier for high band signals are configured in one semiconductor chip.

Figure 7:
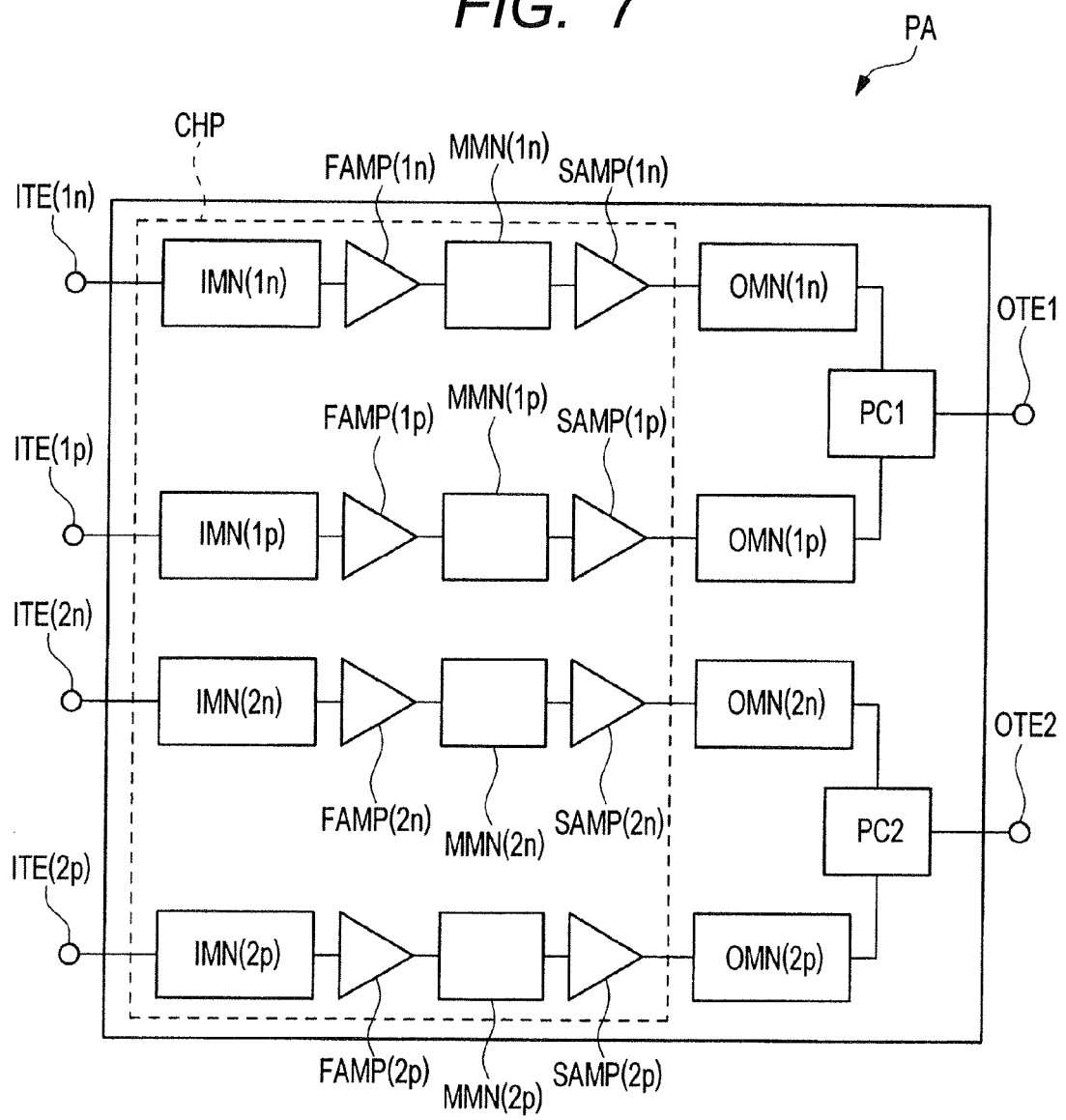
FIG. 7 is a block diagram illustrating a PA module in which a balanced amplifier for low band signals and a balanced amplifier for high band signals are configured.

FIG. 7 is a block diagram illustrating a PA module PA in which a balanced amplifier for low band signals and a balanced amplifier for high band signals are configured. First, a configuration of the balanced amplifier for low band signals illustrated in FIG. 7 is explained. As illustrated in FIG. 7, an input terminal ITE(1n) and an input terminal ITE(1p) are formed in the PA module PA. The path coupled to the input terminal ITE(1n) is a negative path of the balanced amplifier for low band signals. Specifically, the negative path of the balanced amplifier for low band signals is configured with an input matching circuit IMN(1n) coupled to the input terminal ITE(1n), a first stage amplifier circuit FAMP(1n) coupled to the input matching circuit IMN(1n), and an interstage matching circuit MMN(1n) coupled to the first stage amplifier circuit FAMP(1n). The negative path of the balanced amplifier for low band signals is further configured with a last stage amplifier circuit SAMP(1n) coupled to the interstage matching circuit MMN(1n) and an output matching circuit OMN(1n) coupled to the last stage amplifier circuit SAMP(1n).

Similarly, the positive path of the balanced amplifier for low band signals is configured with an input matching circuit IMN(1p) coupled to the input terminal ITE(1p), a first stage amplifier circuit FAMP (1p) coupled to the input matching circuit IMN(1p), and an interstage matching circuit MMN(1p) coupled to the first stage amplifier circuit FAMP(1p). The positive path of the balanced amplifier for low band signals is further configured with a last stage amplifier circuit SAMP(1p) coupled to the interstage matching circuit MMN(1p) and an output matching circuit OMN(1p) coupled to the last stage amplifier circuit SAMP(1p).

The output matching circuit OMN(1n) and the output matching circuit OMN(1p) are coupled to a power combiner PC1, and an output of the power combiner PC1 is coupled to the output terminal OTE1. In this way, the balanced amplifier for low band signals is configured.

Next, the configuration of the balanced amplifier for high band signals is explained. As illustrated in FIG. 7, an input terminal ITE(2n) and an input terminal ITE(2p) are formed in the PA module PA. The path coupled to the input terminal ITE(2n) is a negative path of the balanced amplifier for high band signals. Specifically, the negative path of the balanced amplifier for high band signals is configured with an input matching circuit IMN(2n) coupled to the input terminal ITE(2n), a first stage amplifier circuit FAMP(2n) coupled to the input matching circuit IMN(2n), and an interstage matching circuit MMN(2n) coupled to the first stage amplifier circuit FAMP(2n). The negative path of the balanced amplifier for high band signals is further configured with a last stage amplifier circuit SAMP(2n) coupled to the interstage matching circuit MMN(2n) and an output matching circuit OMN(2n) coupled to the last stage amplifier circuit SAMP(2n).

Similarly, the positive path of the balanced amplifier for high band signals is configured with an input matching circuit IMN(2p) coupled to the input terminal ITE(2p), a first stage amplifier circuit FAMP(2p) coupled to the input matching circuit IMN(2p), and an interstage matching circuit MMN(2p) coupled to the first stage amplifier circuit FAMP(2p). The positive path of the balanced amplifier for high band signals is further configured with a last stage amplifier circuit SAMP(2p) coupled to the interstage matching circuit MMN(2p) and an output matching circuit OMN(2p) coupled to the last stage amplifier circuit SAMP(2p).

The output matching circuit OMN(2n) and the output matching circuit OMN(2p) are coupled to a power combiner PC2, and an output of the power combiner PC2 is coupled to the output terminal OTE2. In this way, the balanced amplifier for high band signals is configured.

With reference to FIG. 7, the above has explained the PA module PA in which the balanced amplifier for low band signals and the balanced amplifier for high band signals are configured. Those components surrounded by a dashed line region among the components of FIG. 7 are formed in a semiconductor chip CHP. In FIG. 7 at this time, the negative path and the positive path of the balanced amplifier for low band signals, and the negative path and the positive path of the balanced amplifier for high band signals are arranged in parallel, respectively. In this case, the amplification path for low-band signals (the negative path and the positive path) and the amplification path for high-band signals (the negative path and the positive path) are formed along closely placed wiring, therefore, coupling capacity between the closely placed wiring becomes large, and as a result, an issue of crosstalk between the low-band signal and the high-band signal manifests itself. Accordingly, when a balanced amplifier for low band signals and a balanced amplifier for high band signals are formed in one small semiconductor chip, it is necessary to devise the layout configuration of the balanced amplifier for low band signals and the balanced amplifier for high band signals, in order to suppress the crosstalk between the low-band signals and the high-band signals. Accordingly, in the present embodiment 1, the layout arrangement of the balanced amplifier for low band signals and the balanced amplifier for high band signals are devised.

<<A Configuration of a PA Module (Balanced Amplifier) (Dual Bands)>>

Figure 8:
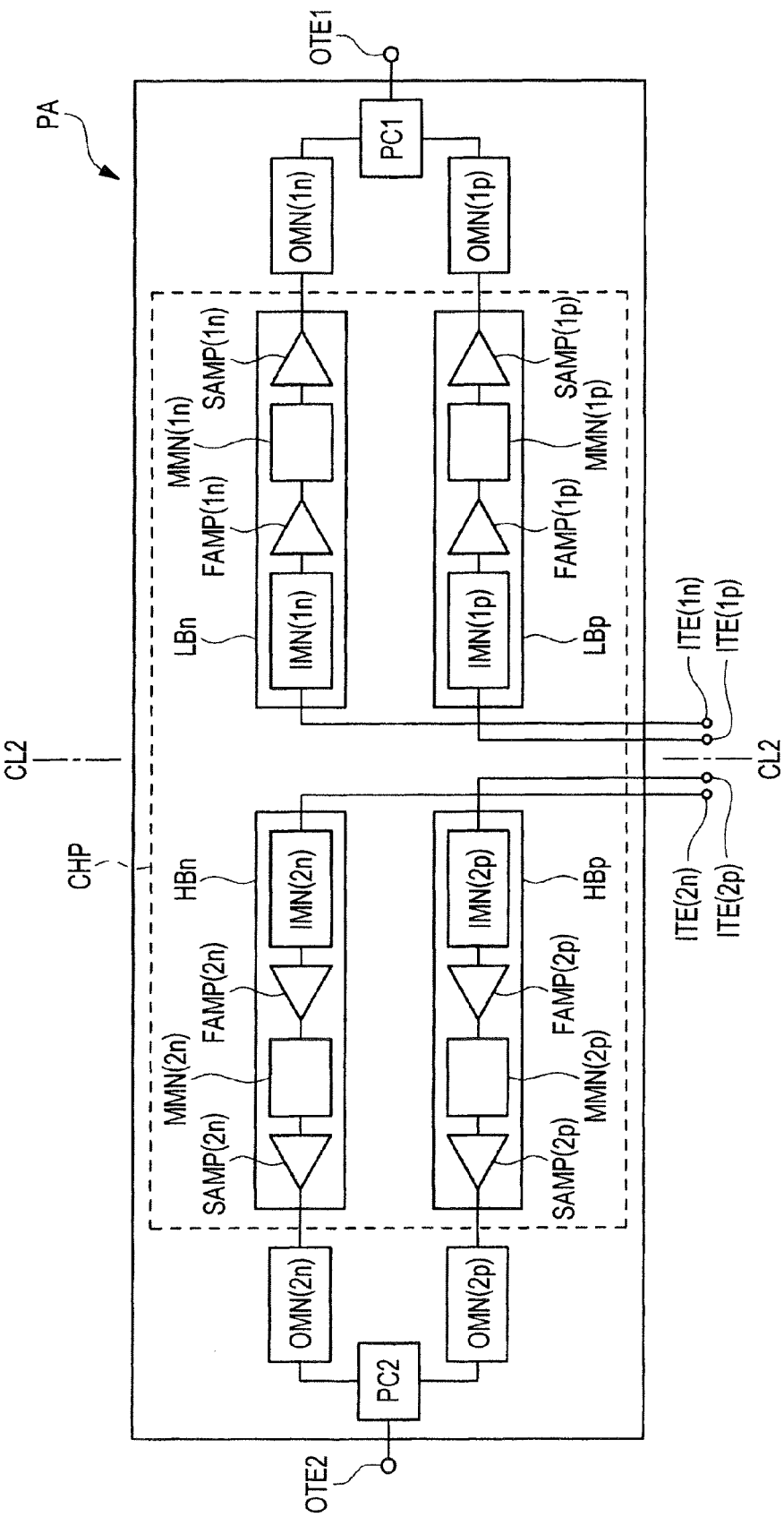
FIG. 8 is a drawing illustrating a configuration of a PA module in an embodiment.

FIG. 8 illustrates a configuration of the PA module PA in the present embodiment 1. As illustrated in FIG. 8, the feature of the PA module PA in the present embodiment 1 lies in that the balanced amplifier for low band signals is formed in one side and the balanced amplifier for high band signals is formed in the other side with respect to a center line CL2 of the PA module PA, and that the input terminals ITE(1n) and ITE(1p) and the input terminals ITE(2n) and ITE(2p) are formed near the center line CL2. By such arrangement, a transmit signal inputted from the input terminals ITE(1n) and ITE(1p) in the balanced amplifier for low band signals follows roughly a path toward the right-hand side of FIG. 8. Meanwhile, a transmit signal inputted from the input terminals ITE(2n) and ITE(2p) in the balanced amplifier for high band signals follows a path toward the left-hand side of FIG. 8. Accordingly, the amplification path of the balanced amplifier for low band signals and the amplification path of the balanced amplifier for high band signals advance in the opposite direction with each other. This means that it is possible to arrange the amplification path of the balanced amplifier for low band signals and the amplification path of the balanced amplifier for high band signals, without running in parallel with each other. Therefore, it is possible to prevent the crosstalk due to parallel running of the amplification path of the balanced amplifier for low band signals and the amplification path of the balanced amplifier for high band signals. As a result, it is possible to improve properties of the PA module PA in which the balanced amplifier for low band signals and the balanced amplifier for high band signals are mounted.

Next, the concrete configuration of the PA module PA is explained. As illustrated in FIG. 8, the balanced amplifier for low band signals is formed in the right-hand side of the center line CL2 of the rectangle-shaped PA module PA. The configuration of the balanced amplifier for low band signals is explained. As illustrated in FIG. 8, the input terminal ITE(1n) and the input terminal ITE(1p) are formed in the vicinity of the center line CL2 of the PA module PA. The path coupled to the input terminal ITE(1n) is a negative path of the balanced amplifier for low band signals. The negative path of the balanced amplifier for low band signals is configured with an input matching circuit IMN(1n) coupled to the input terminal ITE(1n), a first stage amplifier circuit FAMP(1n) coupled to the input matching circuit IMN(1n), and an interstage matching circuit MMN(1n) coupled to the first stage amplifier circuit FAMP(1n). The negative path of the balanced amplifier for low band signals is further configured with a last stage amplifier circuit SAMP(1n) coupled to the interstage matching circuit MMN(1n) and an output matching circuit OMN(1n) coupled to the last stage amplifier circuit SAMP(1n).

Similarly, the positive path of the balanced amplifier for low band signals is configured with an input matching circuit IMN(1p) coupled to the input terminal ITE(1p), a first stage amplifier circuit FAMP(1p) coupled to the input matching circuit IMN(1p), and an interstage matching circuit MMN(1p) coupled to the first stage amplifier circuit FAMP(1p). The positive path of the balanced amplifier for low band signals is further configured with a last stage amplifier circuit SAMP(1p) coupled to the interstage matching circuit MMN(1p) and an output matching circuit OMN(1p) coupled to the last stage amplifier circuit SAMP(1p).

The output matching circuit OMN(1n) and the output matching circuit OMN(1p) are coupled to a power combiner PC1, and an output of the power combiner PC1 is coupled to the output terminal OTE1. In this way, the balanced amplifier for low band signals is configured. Those components surrounded by a dotted line region among the components of the present balanced amplifier for low band signals are formed in the semiconductor chip CHP. Among the components of the balanced amplifier for low band signals (the amplifier for the negative path and the amplifier for the positive path) formed in the semiconductor chip CHP, a path formed with the input matching circuit IMN(1n), the first stage amplifier circuit FAMP(1n), the interstage matching circuit MMN(1n), and the last stage amplifier circuit SAMP(1n) will be called a low-band signal negative path LBn. Similarly, a path formed with the input matching circuit IMN(1p), the first stage amplifier circuit FAMP(1p), the interstage matching circuit MMN(1p), and the last stage amplifier circuit SAMP(1p) will be called a low-band signal positive path LBp.

Next, the configuration of the balanced amplifier for high band signals is explained. As illustrated in FIG. 8, the input terminal ITE(2n) and the input terminal ITE(2p) are formed in the vicinity of the center line CL2 of the PA module PA. The path coupled to the input terminal ITE(2n) is a negative path of the balanced amplifier for high band signals. Specifically, the negative path of the balanced amplifier for high band signals is configured with an input matching circuit IMN(2n) coupled to the input terminal ITE(2n), a first stage amplifier circuit FAMP(2n) coupled to the input matching circuit IMN(2n), and an interstage matching circuit MMN(2n) coupled to the first stage amplifier circuit FAMP(2n). The negative path of the balanced amplifier for high band signals is further configured with a last stage amplifier circuit SAMP(2n) coupled to the interstage matching circuit MMN(2n) and an output matching circuit OMN(2n) coupled to the last stage amplifier circuit SAMP(2n).

Similarly, the positive path of the balanced amplifier for high band signals is configured with an input matching circuit IMN(2p) coupled to the input terminal ITE(2p), a first stage amplifier circuit FAMP(2p) coupled to the input matching circuit IMN(2p), and an interstage matching circuit MMN(2p) coupled to the first stage amplifier circuit FAMP(2p). The positive path of the balanced amplifier for high band signals is further configured with a last stage amplifier circuit SAMP(2p) coupled to the interstage matching circuit MMN(2p) and an output matching circuit OMN(2p) coupled to the last stage amplifier circuit SAMP(2p).

The output matching circuit OMN(2n) and the output matching circuit OMN(2p) are coupled to a power combiner PC2, and an output of the power combiner PC2 is coupled to the output terminal OTE2. In this way, the balanced amplifier for high band signals is configured. Those components surrounded by a dotted line region among the components of the present balanced amplifier for high band signals are formed in a semiconductor chip CHP. Among the components of the balanced amplifier for high band signals (the amplifier for the negative path and the amplifier for the positive path) formed in the semiconductor chip CHP, a path formed with the input matching circuit IMN(2n), the first stage amplifier circuit FAMP(2n), the interstage matching circuit MMN(2n), and the last stage amplifier circuit SAMP(2n) will be called a high-band signal negative path HBn. Similarly, a path formed with the input matching circuit IMN(2p), the first stage amplifier circuit FAMP(2p), the interstage matching circuit MMN(2p), and the last stage amplifier circuit SAMP(2p) will be called a high-band signal positive path HBp.

As described above, as for the PA module PA according to the present embodiment 1, since the balanced amplifier for low band signals and the balanced amplifier for high band signals are arranged to the opposite sides with respect to the center line CL2, it is possible to arrange the amplification path of the balanced amplifier for low band signals and the amplification path of the balanced amplifier for high band signals, without running in parallel with each other. As a result, it is possible to suppress the crosstalk between the balanced amplifier for low band signals and the balanced amplifier for high band signals, and it is also possible to improve properties of the PA module PA <<A Layout Configuration of a PA Module (Balanced Amplifier)>>

Figure 9:
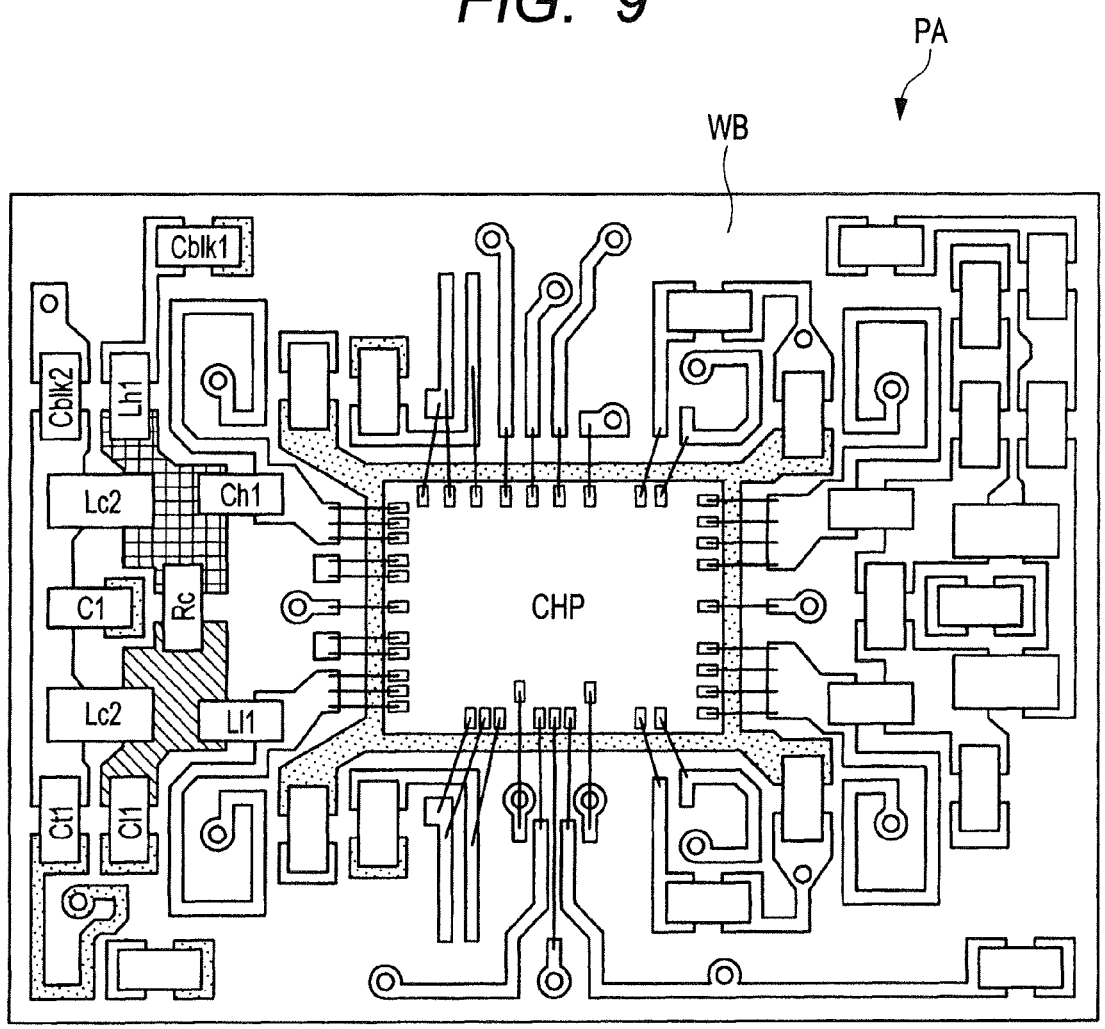
FIG. 9 is a drawing illustrating a mounting configuration of the PA module in the embodiment.

Next, a mounting configuration of the PA module PA in the present embodiment 1 is explained. FIG. 9 illustrates the mounting configuration of the PA module PA in the present embodiment 1. As illustrated in FIG. 9, in the PA module PA of the present embodiment 1, the semiconductor chip CHP is mounted in the central part of the wiring substrate WB of a rectangle shape, and passive components are mounted at the periphery of the semiconductor chip CHP mounted in the wiring substrate WB. Here, in regard to the correspondence relation of FIG. 8 and FIG. 9, the components surrounded with the dashed line illustrated in FIG. 8 are formed in the semiconductor chip CHP illustrated in FIG. 9, and the output matching circuit OMN(1n), the output matching circuit OMN(1p), and the power combiner PC1 illustrated in FIG. 8 are configured with passive components and wiring which are formed in the right side area of the wiring substrate WB illustrated in FIG. 9. On the other hand, the output matching circuit OMN(2n), the output matching circuit OMN(2p), and the power combiner PC2 illustrated in FIG. 8 are configured with passive components and wiring which are formed in the left side region of the wiring substrate WB illustrated in FIG. 9. The sign is specifically attached to the passive components formed in the left side region of the wiring substrate WB in FIG. 9. For example, the output matching circuit OMN(2n), the output matching circuit OMN(2p), and the power combiner PC2 illustrated in FIG. 8 are configured with a capacitor element Ch1, an inductor element L11, a resistor element Rc, an inductor element Lc2, a capacitor element C1, an inductor element Lh1, a capacitor element Cblk1, a capacitor element Cblk2, a capacitor element C11, and a capacitor element Ct1, as illustrated in FIG. 9.

<<Problem in the Present PA Module>>

In the PA module PA in the present embodiment 1, the configuration of the power combiner PC1 and the power combiner PC2 described above are designed to reduce loss of the electric power composition in the power combiner PC1 and the power combiner PC2. In the following, the problem of the power combiner used in the present PA module is explained first, subsequently, the feature of the PA module PA in the present embodiment 1 which is designed to solve the problem is explained.

The above description has explained the PA module PA which is realized in dual bands, and there exist the power combiner PC1 for low-band signals and the power combiner PC2 for high-band signals. However, the following explanation will be made with a focus on the power combiner PC2 for high-band signals, because the technical idea of the present embodiment 1 can be equally applied to the power combiner PC1 and the power combiner PC2. The technical idea of the present embodiment 1 can be applied not only to the power combiner PC2 for high-band signals, but also to the power combiner PC1 for low-band signals, moreover, it can be applied not only to the power combiner used for the dual-band PA module PA (balanced amplifier), but also to the power combiner used for the single-band PA module PA (balanced amplifier).

Figure 10:
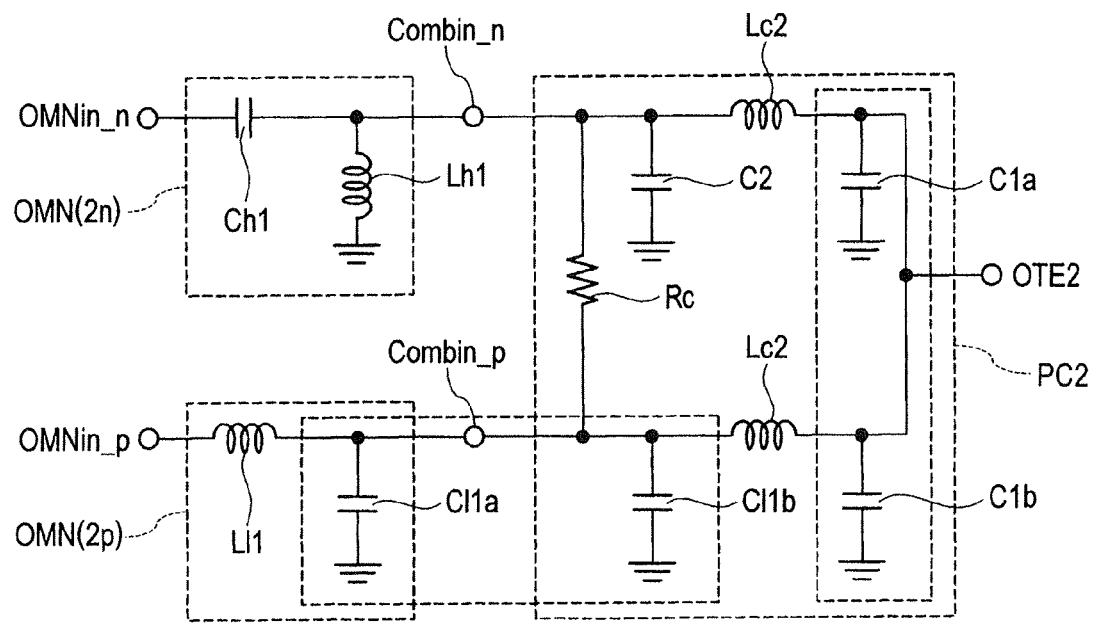
FIG. 10 is a circuit diagram illustrating a circuit configuration of an output matching circuit and a power combiner employed in the present PA module.

FIG. 10 is a circuit diagram illustrating the circuit configuration of the output matching circuit OMN($2n$), the output matching circuit OMN($2p$), and the power combiner PC2 used for the present PA module. In FIG. 10, the negative path for high band signals is coupled to a terminal OMNin_n, and an input of the output matching circuit OMN($2n$) is coupled to the terminal OMNin_n. On the other hand, the positive path for high band signals is coupled to a terminal OMNin_p, and an input of the output matching circuit OMN($2p$) is coupled to the terminal OMNin_p. An output of the output matching circuit OMN($2n$) is coupled to an input of the power combiner PC2 via a terminal Combin_n, and an output of the output matching circuit OMN($2p$) is coupled to an input of the power combiner PC2 via a terminal Combin_p. An output of the power combiner PC2 is coupled to an output terminal OTE2.

Here, in the present PA module, the output matching circuit OMN($2n$) comprises the capacitor element Ch1 coupled in series between the terminal OMNin_n and the terminal Combin_n, and the inductor element Lh1 coupled between the terminal Combin_n and the ground. In the output matching circuit OMN($2n$) configured in this way, phase of a transmit signal inputted from the terminal OMNin_n can be shifted by −45 degrees, and at the same time, impedance matching can be achieved. Similarly, the output matching circuit OMN($2p$) comprises the inductor element L11 coupled in series between the terminal OMNin_p and the terminal Combin_p and the capacitor element C1a coupled between the terminal Combin_p and the ground. In the output matching circuit OMN($2p$) configured in this way, phase of a transmit signal inputted from the terminal OMNin_p can be shifted by +45 degrees, and at the same time, impedance matching can be achieved.

Next, the power combiner PC2 comprises the resistor element Rc coupled between the terminal Combin_n and the terminal Combin_p, the capacitor element C2 coupled between the terminal Combin_n and the ground, the inductor element Lc2 coupled in series between the terminal Combin_n and the output terminal OTE2, and the capacitor element C1a coupled between the output terminal OTE2 and the ground. Furthermore, the power combiner PC2 comprises the capacitor element C11b coupled between the terminal Combin_p and the ground, the inductor element Lc2 coupled in series between the terminal Combin_p and the output terminal OTE2, and the capacitor element C1b coupled between the output terminal OTE2 and the ground. The power combiner PC2 configured in this way is the so-called Wilkinson-type power combiner.

According to the output matching circuit OMN($2n$), the output matching circuit OMN($2p$), and the power combiner PC2 illustrated in FIG. 10, although the phase difference between the transmit signal inputted into the terminal OMNin_n (henceforth called a first transmit signal) and the transmit signal inputted into the terminal OMNin_p (henceforth called a second transmit signal) is 90 degrees, when the first transmit signal passes through the output matching circuit OMN($2n$), the phase of the first transmit signal shifts by −45 degrees and when the second transmit signal passes through the output matching circuit OMN($2p$), the phase of the second transmit signal shifts by +45 degrees. As a result, the phase of the first transmit signal to be inputted into the terminal Combin_n and the phase of the second transmit signal to be inputted into the terminal Combin_p become matched. The first transmit signal and the second transmit signal, which are matched in phase, are combined by the power combiner PC2, and the combined signal is outputted from the output terminal OTE2.

The Wilkinson-type power combiner PC2 exhibits the minimum loss of the electric power composition when the phase of the first transmit signal to be inputted into the terminal Combin_n and the phase of the second transmit signal to be inputted into the terminal Combin_p are matched. In the Wilkinson-type power combiner PC2, the phase difference of the signal which flows through the resistor element Rc coupled between the terminal Combin_n and the terminal Combin_p, and the signal which flows into the terminal Combin_p from the terminal Combin_n via the output terminal OTE2 becomes 180 degrees. Therefore, the signal which flows into the terminal Combin_p from the terminal Combin_n via the resistor element Rc, and the signal which flows into the terminal Combin_p from the terminal Combin_n via the output terminal OTE2 are canceled at the terminal Combin_p. As a result, the isolation property between the terminal Combin_n and the terminal Combin_p is ensured.

By employing the Wilkinson-type power combiner PC2 configured in this way, it is possible to combine the first transmit signal which is transmitted through the negative path for high band signals, and the second transmit signal which is transmitted through the positive path for high band signals. At this time, the power combiner PC2 is formed with the chip type components and wiring which are formed over the wiring substrate WB, for example, as illustrated in FIG. 9. Therefore, it is desired to reduce the number of the chip type components which configure the power combiner PC2, from a viewpoint of attaining reduction in cost and reduction in size of the PA module. Accordingly, in the Wilkinson-type power combiner PC2 illustrated in FIG. 10, there is an extensive effort underway to reduce four chip capacitors which configure the power combiner PC2.

For example, as illustrated in FIG. 10, the capacitor element C11a which configures the output matching circuit OM($2p$), and the capacitor element C11b which configures the power combiner PC2 are components which are coupled in parallel between the terminal Combin_p and the ground. Therefore, the two capacitor elements may share one capacitor element. Similarly, the capacitor element C1a which configures the power combiner PC2, and the capacitor element C1b which configures the power combiner PC2 are components which are coupled in parallel between the output terminal OTE2 and the ground. Therefore, the two capacitor elements may share one capacitor element.

Figure 11:
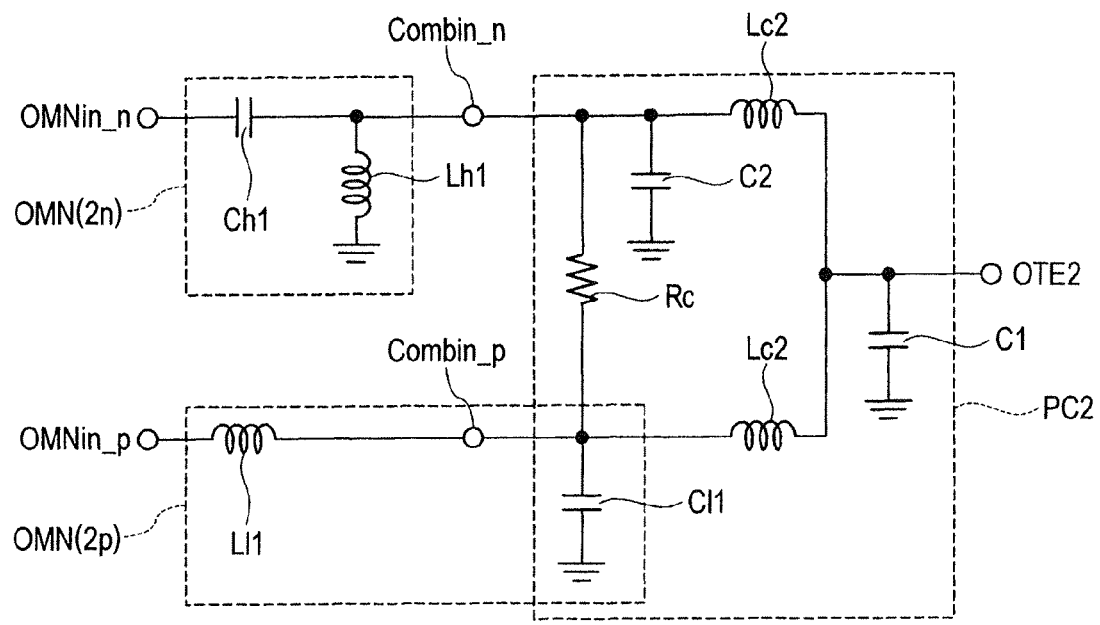
FIG. 11 is a circuit diagram illustrating a configuration of an output matching circuit and a power combiner in which sharing of components is advanced.

FIG. 11 is a circuit diagram illustrating the configuration of the output matching circuit OMN($2n$), the output matching circuit OMN($2p$), and the power combiner PC2, in which sharing of components is advanced. A capacitor element C11 illustrated in FIG. 11 is a component shared by the capacitor element C11a and the capacitor element C11b, illustrated in FIG. 10. A capacitor element C1 illustrated in FIG. 11 is a component shared by the capacitor element C1a and the capacitor element C1b, illustrated in FIG. 10. As seen from the comparison of FIG. 10 and FIG. 11, in contrast to the fact that the power combiner PC2 illustrated in FIG. 10 requires four capacitor elements (the capacitor element C2, the capacitor element C1a, the capacitor element C1b, and the capacitor element C11b), the power combiner PC2 illustrated in FIG. 11 requires only three capacitor elements (the capacitor element C2, the capacitor element C1, and the capacitor element C11). As a result, the power combiner PC2 illustrated in FIG.

11 can reduce the number of parts, compared with the power combiner PC2 illustrated in FIG. 10.

In this way, although reduction of the number of parts can be aimed at in the power combiner PC2 illustrated in FIG. 11 compared with the power combiner PC2 illustrated in FIG. 10, it is desired to further promote reduction in cost and reduction in size of the PA module. Therefore, eliminating the capacitor element C2 which configures the Wilkinson-type power combiner PC2 illustrated in FIG. 11 is aimed at, for example. That is, since the capacitor element C2 does not have another capacitor element which is coupled in parallel with each other, the capacitor element C2 remains without realizing the sharing of components. However, attempt is made to further promote reduction in cost and reduction in size of the PA module by eliminating the capacitor element C2. Since the capacitor element C2 is one of essential components which configure the Wilkinson-type power combiner PC2, elimination of the capacitor element C2 will deteriorate the properties of the Wilkinson-type power combiner PC2. That is, the loss of the electric power composition will also increase by the elimination of the capacitor element C2. Furthermore, in the Wilkinson-type power combiner PC2 in which the capacitor element C2 is eliminated, the phase difference of the signal which flows through the resistor element Rc coupled between the terminal Combin_n and the terminal Combin_p, and the signal which flows into the terminal Combin_p from the terminal Combin_n via the output terminal OTE2 does not become 180 degrees. This will result in the fact that the signal which flows into the terminal Combin_p from the terminal Combin_n via the resistor element Rc, and the signal which flows into the terminal Combin_p from the terminal Combin_n via the output terminal OTE2 are not canceled at the terminal Combin_p. As a result, the isolation property between the terminal Combin_n and the terminal Combin_p will deteriorate. In this way, elimination of the capacitor element C2 will produce property degradation of the power combiner PC2. However, under the present circumstances, priority is given to realization of the reduction in cost and the reduction in size of the PA module through the elimination of the capacitor element C2, admitting the property degradation of the power combiner PC2. That is, under the present circumstances, priority is given to realization of the reduction in cost and the reduction in size of the PA module, compromising the property degradation of the power combiner PC2.

In this way, in the Wilkinson-type power combiner PC2, it is seen that the reduction in cost and the reduction in size of the PA module are realized, at the expense of the property degradation of the power combiner PC2. Accordingly, in the Wilkinson-type power combiner PC2, it is considered difficult to further promote the reduction in cost and the reduction in size of the PA module. From this reason, another approach is adopted for realizing the reduction in cost and the reduction in size of the PA module, by employing a power combiner of a type different from the Wilkinson-type power combiner as the power combiner PC2. Specifically, employment of a Webb-type power combiner in lieu of the Wilkinson-type power combiner, as the power combiner PC2 of the PA module, is studied.

Figure 12:
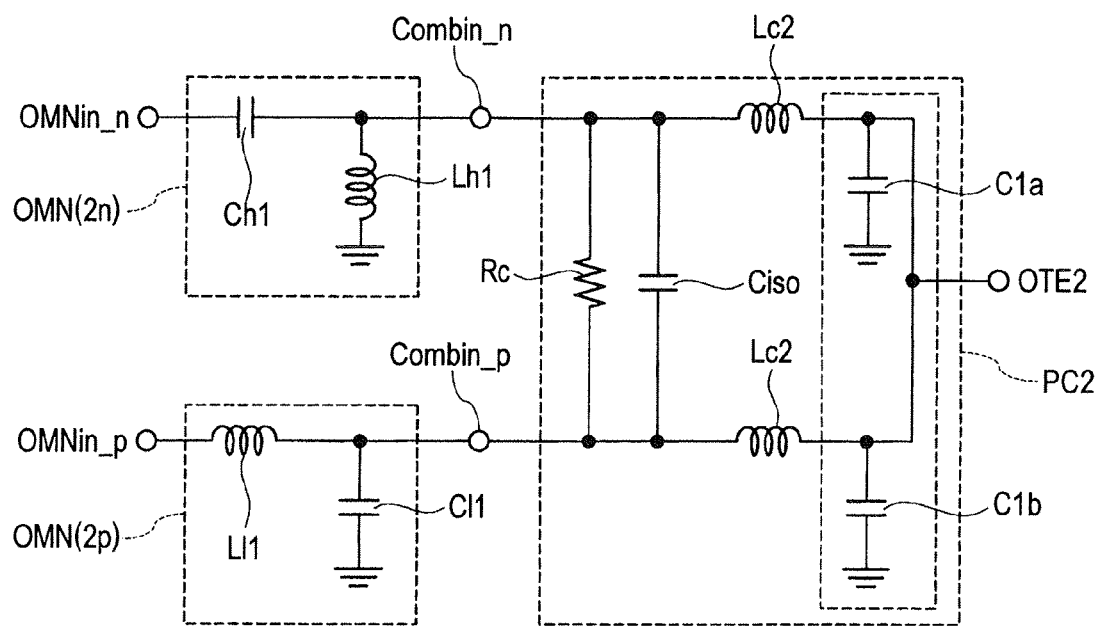
FIG. 12 is a circuit diagram illustrating a circuit configuration of an output matching circuit and a power combiner employed in a PA module.

In the following, the Webb-type power combiner PC2 is explained. FIG. 12 is a circuit diagram illustrating a circuit configuration of an output matching circuit OMN(2n), an output matching circuit OMN(2p), and a power combiner PC2 employed for the PA module. In FIG. 12, the negative path for high band signals is coupled to a terminal OMNin_n, and an input of the output matching circuit OMN(2n) is coupled to the terminal OMNin_n. On the other hand, the positive path for high band signals is coupled to a terminal OMNin_p, and an input of the output matching circuit OMN(2p) is coupled to the terminal OMNin_p. An output of the output matching circuit OMN(2n) is coupled to an input of the power combiner PC2 via a terminal Combin_n, and an output of the output matching circuit OMN(2p) is coupled to an input of the power combiner PC2 via a terminal Combin_p. An output of the power combiner PC2 is coupled to an output terminal OTE2.

Here, in the present PA module, the output matching circuit OMN(2n) comprises the capacitor element Ch1 coupled in series between the terminal OMNin_n and the terminal Combin_n, and the inductor element Lh1 coupled between the terminal Combin_n and the ground. In the output matching circuit OMN(2n) configured in this way, phase of a transmit signal inputted from the terminal OMNin_n can be shifted by −45 degree, and at the same time, impedance matching can be achieved. Similarly, the output matching circuit OMN(2p) comprises the inductor element L11 coupled in series between the terminal OMNin_p and the terminal Combin_p and the capacitor element C11 coupled between the terminal Combin_p and the ground. In the output matching circuit OMN(2p) configured in this way, phase of a transmit signal inputted from the terminal OMNin_p can be shifted by +45 degrees, and at the same time, impedance matching can be achieved.

Next, the power combiner PC2 comprises a resistor element Rc and a capacitor element (isolation capacitor element) Ciso which are coupled between the terminal Combin_n and the terminal Combin_p, the inductor element Lc2 coupled in series between the terminal Combin_n and the output terminal OTE2, and the capacitor element C1a coupled between the output terminal OTE2 and the ground. Furthermore, the power combiner PC2 comprises the inductor element Lc2 coupled in series between the terminal Combin_p and the output terminal OTE2, and the capacitor element C1b coupled between the output terminal OTE2 and the ground. The power combiner PC2 configured in this way is the so-called Webb-type power combiner.

According to the output matching circuit OMN(2n), the output matching circuit OMN(2p), and the power combiner PC2 illustrated in FIG. 12, although the phase difference between the first transmit signal inputted into the terminal OMNin_n and the second transmit signal inputted into the terminal OMNin_p is 90 degrees, when the first transmit signal passes through the output matching circuit OMN(2n), the phase of the first transmit signal shifts by −45 degrees, and when the second transmit signal passes through the output matching circuit OMN(2p), the phase of the second transmit signal shifts by +45 degrees. As a result, the phase of the first transmit signal to be inputted into the terminal Combin_n and the phase of the second transmit signal to be inputted into the terminal Combin_p become matched. The first transmit signal and the second transmit signal, which are matched in phase, are combined by the power combiner PC2, and the combined signal is outputted from the output terminal OTE2.

As is the case with the Wilkinson-type power combiner, the present Webb-type power combiner PC2 exhibits the minimum loss of the electric power composition when the phase of the first transmit signal to be inputted into the terminal Combin_n and the phase of the second transmit signal to be inputted into the terminal Combin_p are matched. In the Webb-type power combiner PC2, the phase difference of the signal which flows through the resistor element Rc and the capacitor element Ciso coupled between the terminal Combin_n and the terminal Combin_p, and the signal which flows into the terminal Combin_p from the terminal Combin_n via the output terminal OTE2 becomes 180 degrees. Therefore, the signal which flows into the terminal Combin_p from the terminal Combin_n via the resistor element Rc, and the signal which flows into the terminal Combin_p from the terminal Combin_n via the output terminal OTE2 are canceled at the terminal Combin_p. As a result, the isolation property between the terminal Combin_n and the terminal Combin_p is ensured.

Here, the difference between the Webb-type power combiner and the Wilkinson-type power combiner is explained. First, in the Wilkinson type power combiner, as for the signal transmitted from the terminal Combin_n to the terminal Combin_p via the resistor element Rc, since the resistor element Rc does not possess a function to shift a phase as described above, there is no phase difference between the phase of the signal outputted from the terminal Combin_n and the signal inputted into the terminal Combin_p via resistor element Rc. On the other hand, in the Wilkinson-type power combiner, as for the signal transmitted from the terminal Combin_n to the terminal Combin_p via the output terminal OTE2, owing to the phase shifting function by the inductor element Lc2 and the capacitor elements (the capacitor element C2, the capacitor element C1, and the capacitor element C11), illustrated in FIG. 11, the phase difference of 180 degrees is generated between the phase of the signal outputted from the terminal Combin_n, and the signal inputted into the terminal Combin_p via the output terminal OTE2. Accordingly, the signal transmitted from the terminal Combin_n to the terminal Combin_p via the resistor element Rc and the signal transmitted from the terminal Combin_n to the terminal Combin_p via the output terminal OTE2 are canceled at the terminal Combin_p, when superimposed. In this way, in the Wilkinson-type power combiner, the isolation property between the terminal Combin_n and the terminal Combin_p is ensured.

As compared with this, in the Webb-type power combiner, as for the signal transmitted from the terminal Combin_n to the terminal Combin_p via the resistor element Rc and the capacitor element Ciso, the capacitor element Ciso possesses a function to shift the phase −90 degrees, accordingly, the phase difference between the phase of the signal outputted from the terminal Combin_n and the signal to be inputted into the terminal Combin_p via the resistor element Rc and the capacitor element Ciso becomes −90 degrees. In the Webb-type power combiner, as for the signal transmitted from the terminal Combin_n to the terminal Combin_p via the output terminal OTE2, owing to the phase shifting function of the inductor element Lc2 and the capacitor element (the capacitor element C1a and the capacitor element C1b) illustrated in FIG. 12, the phase difference of +90 degrees is generated between the phase of the signal outputted from the terminal Combin_n, and the signal to be inputted into the terminal Combin_p via the output terminal OTE2. Accordingly, the phase of the signal transmitted from the terminal Combin_n to the terminal Combin_p via the resistor element Rc and the capacitor element Ciso and the phase of the signal transmitted from the terminal Combin_n to the terminal Combin_p via the output terminal OTE2 becomes 180 degrees at the terminal Combin_p, and these signals are canceled at the terminal Combin_p, when superimposed. In this way, in the Webb-type power combiner, the isolation property between the terminal Combin_n and the terminal Combin_p is ensured.

As described above, the Webb-type power combiner and the Wilkinson-type power combiner have different configurations for ensuring the isolation property between the terminal Combin_n and the terminal Combin_p.

Here, in the Webb-type power combiner PC2 illustrated in FIG. 12, the capacitor element C1a which configures the power combiner PC2, and the capacitor element C1b which configures the power combiner PC2 are components which are coupled in parallel between the output terminal OTE2 and the ground. Therefore, the two capacitor elements may share one capacitor element.

Figure 13:
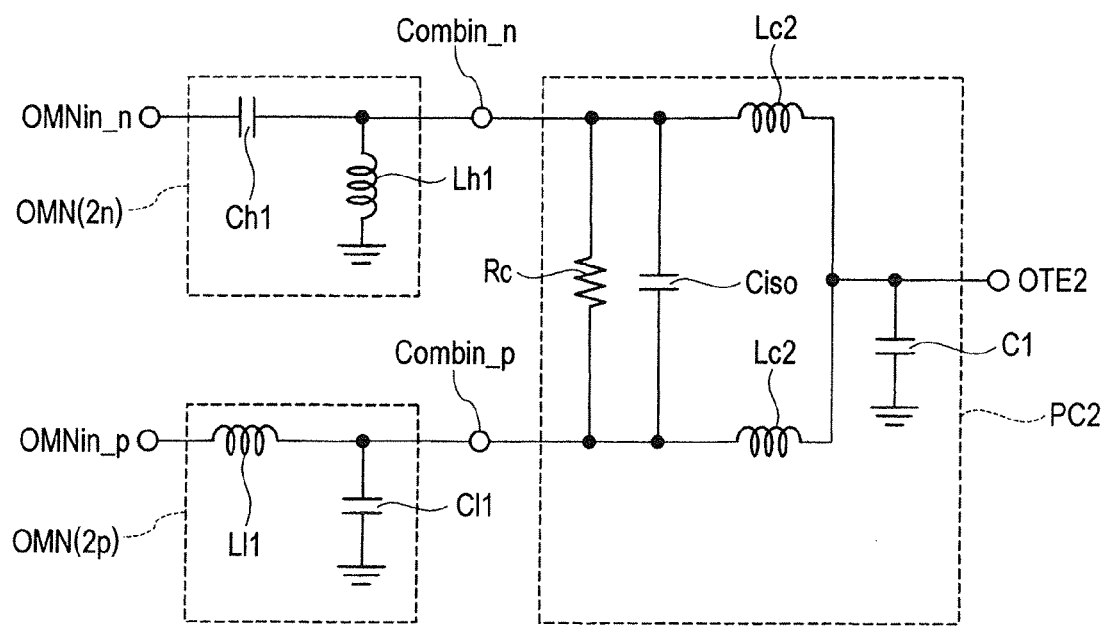
FIG. 13 is a circuit diagram illustrating a configuration of an output matching circuit and a power combiner in which sharing of components is advanced.

FIG. 13 is a circuit diagram illustrating the configuration of the output matching circuit OMN(2n), the output matching circuit OMN(2p), and the power combiner PC2, in which sharing of components is advanced. As illustrated in FIG. 13, in the Webb-type power combiner PC2, the required capacitor elements can be configured with two capacitor elements (the capacitor element Ciso and the capacitor element C1). As a result, it is seen that the Webb-type power combiner PC2 illustrated in FIG. 13 is useful from a viewpoint of attaining the reduction in cost and the reduction in size of the PA module. That is, the Wilkinson-type power combiner PC2 illustrated in FIG. 1 requires three capacitor elements (the capacitor element C2, the capacitor element C1, and the capacitor element C11) under normal circumstances, however, as explained in the above, priority is given to realizing the reduction in cost and the reduction in size of the PA module through the elimination of the capacitor element C2, sacrificing the properties of the power combiner PC2. In contrast to this, the Webb-type power combiner PC2 can be configured with two capacitor elements (the capacitor element Ciso and the capacitor element C1) without sacrificing the properties of the power combiner PC2, as illustrated in FIG. 13; therefore, it is proved that, compared with the Wilkinson-type power combiner PC2, the Webb-type power combiner PC2 has an advantage that the reduction in cost and the reduction in size of the PA module can be enhanced, maintaining the properties of the power combiner PC2. From a viewpoint of attaining further reduction in cost and further reduction in size of the PA module, it has been studied to form the capacitor element Ciso which configures the Webb-type power combiner PC2 as an interlayer capacitor element of a multilayer wiring board in stead of a chip type component. However, the present inventors have found out that the following problem occurs if the capacitor element Ciso is formed as an interlayer capacitor element of the wiring substrate. The following explains the problem which the present inventors have found out.

Figure 14:
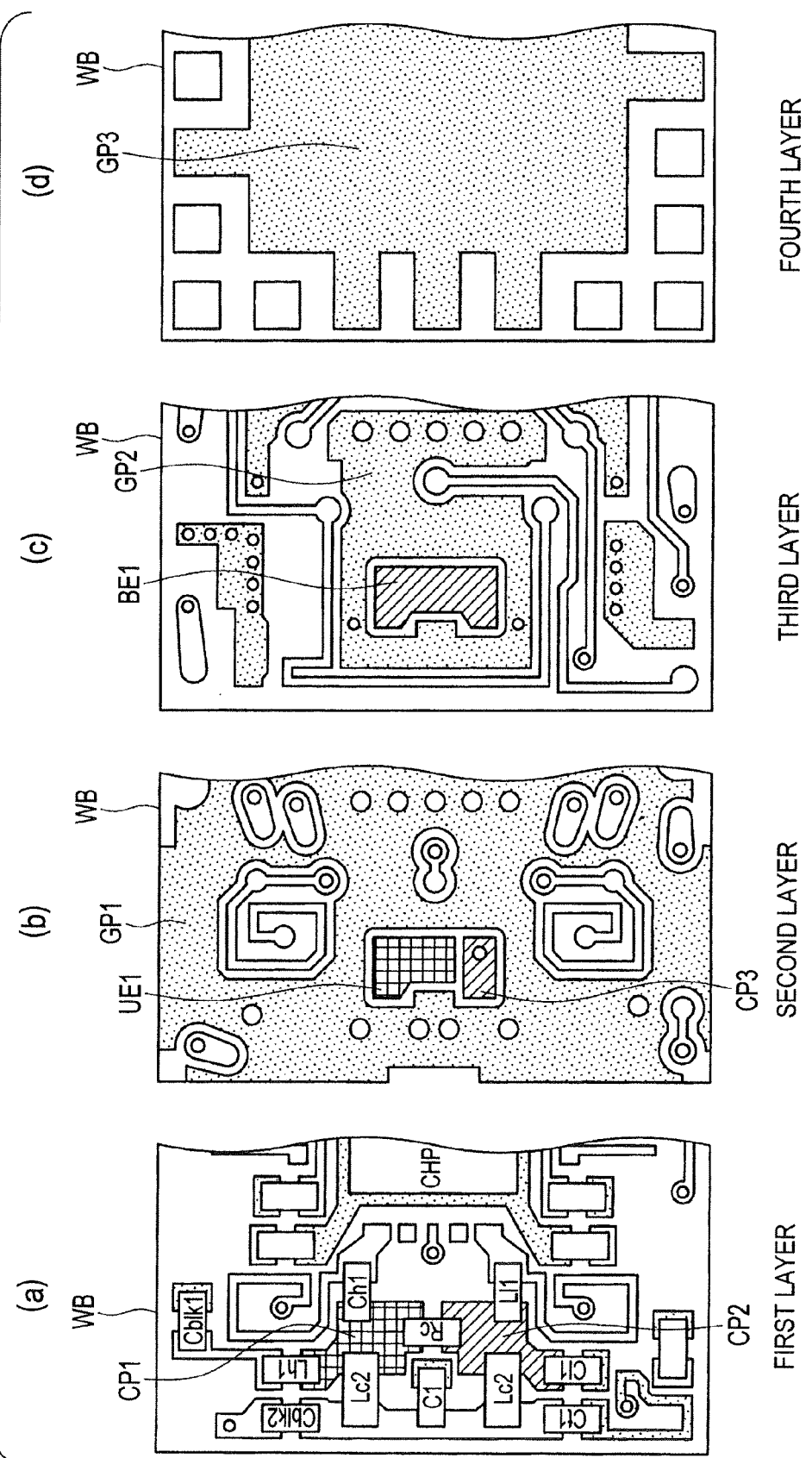
FIG. 14(a), FIG. 14(b), FIG. 14(c), and FIG. 14(d) are plan views respectively illustrating a partial area of each layer of a wiring substrate in which a PA module is formed.

FIG. 14(a), FIG. 14(b), FIG. 14(c), and FIG. 14(d) are plan views respectively illustrating a partial area of each layer of a wiring substrate in which a PA module is formed. A wiring substrate WB has a multilayer wiring structure, for example, a four-layer structure, each separated with an interlayer insulation film, as illustrated in FIG. 14. Specifically, as illustrated in FIG. 14(a), a semiconductor chip CHP and chip type components (passive components) are mounted over a first layer (surface) of the wiring substrate WB. A conductor pattern CP1 illustrated in FIG. 14(a) is a pattern having the same potential with the terminal Combin_n illustrated in FIG. 13, and a conductor pattern CP2 illustrated in FIG. 14(a) is a pattern having the same potential with the terminal Combin_p illustrated in FIG. 13.

Next, as illustrated in FIG. 14(b), a second layer is formed in the lower layer of the first layer of the wiring substrate WB, and an upper electrode UE1 and a conductor pattern CP3 are formed in the second layer. At this time, the upper electrode UE1 is electrically coupled to the conductor pattern CP1 illustrated in FIG. 14(a) via a plug (not shown), for example. That is, the upper electrode UE1 formed in the second layer of the wiring substrate WB has the same potential with the conductor pattern CP1 formed in the first layer of the wiring substrate WB. On the other hand, the conductor pattern CP3 is electrically coupled to the conductor pattern CP2 illustrated in FIG. 14(a) via a plug (not shown), for example. That is, the conductor pattern CP3 formed in the second layer of the wiring substrate WB has the same potential with the conductor pattern CP2 formed in the first layer of the wiring substrate WB. A ground pattern (a reference-potential conductor plane) GP1 is formed in the second layer so as to surround the circumference of the upper electrode UE1 and the conductor pattern CP3.

Next, as illustrated in FIG. 14(c), a third layer is formed in the lower layer of the second layer of the wiring substrate WB, and a lower electrode BE1 is formed in the third layer. Here, the lower electrode BE1 is electrically coupled to the conductor pattern CP3 illustrated in FIG. 14(b) via a plug (not shown), for example. That is, the lower electrode BE1 formed in the third layer of the wiring substrate WB has the same potential with the conductor pattern CP3 formed in the second layer of the wiring substrate WB. Accordingly, the conductor pattern CP2 formed in the first layer of the wiring substrate WB, the conductor pattern CP3 formed in the second layer, and the lower electrode BE1 formed in the third layer are electrically coupled with each other and have the same potential. A ground pattern GP2 is formed in the third layer so as to surround the circumference of the lower electrode BE1.

Next, as illustrated in FIG. 14(d), a fourth layer is formed in the lower layer of the third layer of the wiring substrate WB. The fourth layer is the back of the wiring substrate WB. A ground pattern GP3 is formed in the fourth layer of the wiring substrate WB. In the wiring substrate WB with the four-layer structure configured in this way, the capacitor element Ciso illustrated in FIG. 13 is formed by the upper electrode UE1 formed in the second layer, the lower electrode BE1 formed in the third layer, and the interlayer insulation film (functioning as a capacity insulation film) sandwiched by the upper electrode UE1 and the lower electrode BE1. In this way, it is possible to reduce the chip type components in number by forming the capacitor element Ciso illustrated in FIG. 13 not as a chip type component but as an interlayer capacitor element of the wiring substrate WB.

However, when the capacitor element Ciso is formed as an interlayer capacitor element, the following problems will become actual. That is, the ground pattern GP1 fixed to the reference potential is formed in the circumference of the upper electrode UE1 which configures the capacitor element Ciso, as illustrated in FIG. 14(b), therefore, parasitic capacitance is formed between the upper electrode UE1 and the ground pattern GP1. On the other hand, the ground pattern GP2 fixed to the reference potential is formed in the circumference of the lower electrode BE1 which configures the capacitor element Ciso, as illustrated in FIG. 14(c), therefore, parasitic capacitance is formed between the lower electrode BE1 and the ground pattern GP2. Furthermore, the ground pattern GP3 is formed in the fourth layer as the lower layer of the lower electrode BE1; therefore, parasitic capacitance is formed also between the lower electrode BE1 and the ground pattern GP3.

As describe above, parasitic capacitance is generated between the terminal Combin_n which is at the same potential as the upper electrode UE1 and the ground, and also between the terminal Combin_p which is at the same potential as the lower electrode BE1 and the ground.

Figure 15:
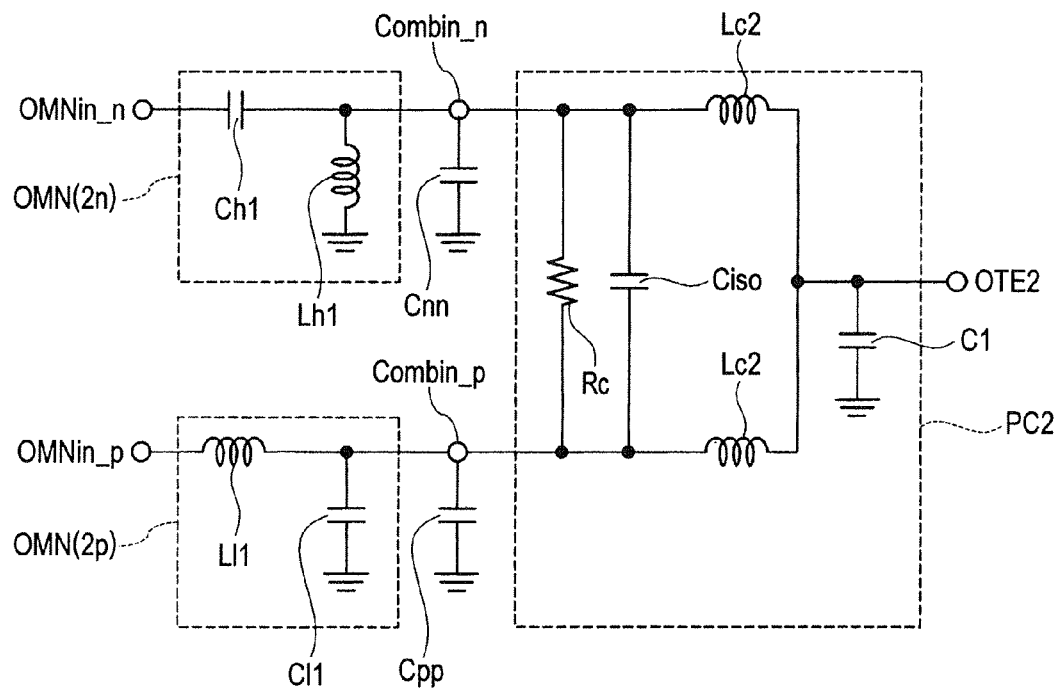
FIG. 15 is a circuit diagram illustrating a circuit configuration of an output matching circuit and a Webb-type power combiner which are employed in a PA module, including a parasitic capacitance.

FIG. 15 is a circuit diagram illustrating the circuit configuration of the output matching circuit OMN(2n), the output matching circuit OMN(2p), and the Webb-type power combiner PC2 which are employed in the PA module, illustrating the parasitic capacitance as well. As illustrated in FIG. 15, as a result of forming the capacitor element Ciso as an interlayer capacitor element of the wiring substrate WB, it is seen that the parasitic capacitance Cnn is formed between the terminal Combin_n and the ground, and the parasitic capacitance Cpp is formed between the terminal Combin_p and the ground.

Here, the parasitic capacitance Cnn is dominated by the parasitic capacitance formed between the upper electrode UE1 and the ground pattern GP1 as illustrated in FIG. 14(b). As compared with this, the parasitic capacitance Cpp is mainly attributed to the combination of the parasitic capacitance formed between the conductor pattern CP3 and the ground pattern GP1 as illustrated in FIG. 14(b), the parasitic capacitance formed between the lower electrode BE1 and the ground pattern GP2 as illustrated in FIG. 14(c), and the parasitic capacitance formed between the lower electrode BE1 and the ground pattern GP3 as illustrated in FIG. 14(c) and FIG. 14(d). Accordingly, the value of capacitance of the parasitic capacitance Cnn and the value of capacitance of the parasitic capacitance Cpp are greatly different.

For example, in FIG. 15, when the phase of the first transmit signal to be inputted into the terminal Combin_n which is one input port of the Webb-type power combiner PC2 and the phase of the second transmit signal to be inputted into the terminal Combin_p which is the other input port of the Webb-type power combiner PC2 are matched, the loss of the electric power composition by the Webb-type power combiner PC2 becomes the smallest. However, even if the output matching circuit OMN(2n) and the output matching circuit OMN(2p) are designed as illustrated in FIG. 15 so that the phase of the first transmit signal to be inputted into the terminal Combin_n which is one input port of the Webb-type power combiner PC2 and the phase of the second transmit signal to be inputted into the terminal Combin_p which is the other input port of the Webb-type power combiner PC2 may be matched, the phase of the first transmit signal and the phase of the second transmit signal will shift, when the parasitic capacitance Cnn and the parasitic capacitance Cpp which are different in the value of capacitance are present. That is, even if the parasitic capacitance Cnn and the parasitic capacitance Cpp are present, there hardly arises the phase shift of the phase of the first transmit signal and the second transmit signal, as long as the respective values of capacitance are equal. However, when the value of capacitance of the parasitic capacitance Cnn differs from the value of capacitance of the parasitic capacitance Cpp, the phase balance of the first transmit signal and the second transmit signal which are inputted into the Webb-type power combiner PC2 will be lost. As a result, there arises the problem that the loss of the electric power composition in the Webb-type power combiner PC2 becomes large.

Accordingly, on the premise that the capacitor element Ciso, which is a component part of the Webb-type power combiner PC2, is formed with the interlayer capacitor element of the wiring substrate WB, from a viewpoint of attaining the reduction in cost and the reduction in size of the PA module, the present inventors have devised to make as equal as possible the respective values of capacitance of the parasitic capacitance Cnn and the parasitic capacitance Cpp, which are induced by composing the capacitor element Ciso from the interlayer capacitor element. The following explains the technical idea of the present embodiment to which the above-described device is added.

Feature in the Present Embodiment

Circuit Configuration

Figure 16:
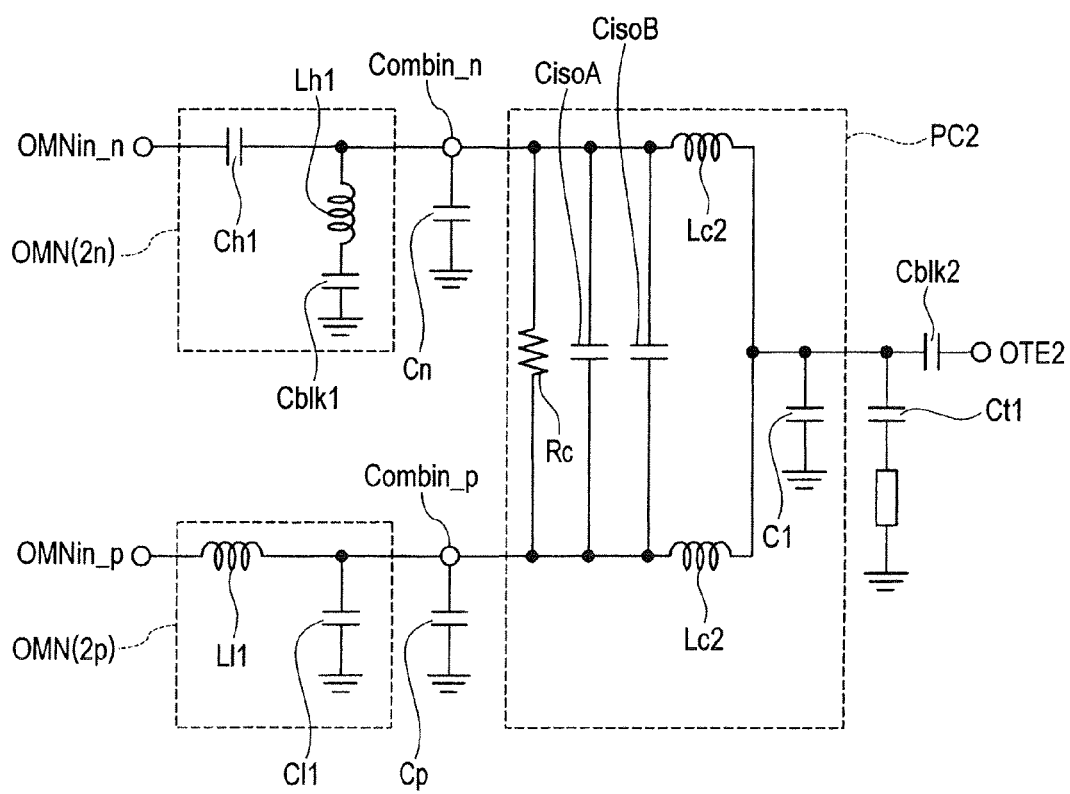
FIG. 16 is a circuit diagram illustrating a circuit configuration of an output matching circuit and a Webb-type power combiner in the embodiment, including a parasitic capacitance.

FIG. 16 is a circuit diagram illustrated the circuit configuration of the output matching circuit OMN(2n), the output matching circuit OMN(2p), and the Webb-type power combiner PC2 in the present embodiment, illustrating the parasitic capacitance as well. In FIG. 16, the negative path for high band signals is coupled to a terminal OMNin_n, and an input of the output matching circuit OMN(2n) is coupled to the terminal OMNin_n. On the other hand, the positive path for high band signals is coupled to a terminal OMNin_p, and an input of the output matching circuit OMN(2p) is coupled to the terminal OMNin_p. An output of the output matching circuit OMN(2n) is coupled to an input of the power combiner PC2 via a terminal Combin_n, and an output of the output matching circuit OMN(2p) is coupled to an input of the power combiner PC2 via a terminal Combin_p. An output of the power combiner PC2 is coupled to an output terminal OTE2.

Here, in the present PA module, the output matching circuit OMN(2n) comprises the capacitor element Ch1 coupled in series between the terminal OMNin_n and the terminal Combin_n, and the inductor element Lh1 coupled between the terminal Combin_n and the ground. In the output matching circuit OMN(2n) configured in this way, phase of a transmit signal inputted from the terminal OMNin_n can be shifted by −45 degrees, and at the same time, impedance matching can be achieved. Similarly, the output matching circuit OMN(2p) comprises the inductor element L11 coupled in series between the terminal OMNin_p and the terminal Combin_p and the capacitor element C11 coupled between the terminal Combin_p and the ground. In the output matching circuit OMN(2p) configured in this way, phase of a transmit signal inputted from the terminal OMNin_p can be shifted by +45 degrees, and at the same time, impedance matching can be achieved.

Next, the power combiner PC2 comprises the resistor element Rc, a capacitor element (an isolation capacitor element) CisoA, and a capacitor element (an isolation capacitor element) CisoB, all of which are coupled between the terminal Combin_n and the terminal Combin_p, the inductor element Lc2 coupled in series between the terminal Combin_n and the output terminal OTE2, and the capacitor element C1 coupled between the output terminal OTE2 and the ground.

According to the output matching circuit OMN(2n), the output matching circuit OMN(2p), and the power combiner PC2 illustrated in FIG. 16, although the phase difference between the first transmit signal inputted into the terminal OMNin_n and the second transmit signal inputted into the terminal OMNin_p is 90 degrees, when the first transmit signal passes through the output matching circuit OMN(2n), the phase of the first transmit signal shifts by −45 degrees, and when the second transmit signal passes through the output matching circuit OMN(2p), the phase of the second transmit signal shifts by +45 degrees. As a result, the phase of the first transmit signal to be inputted into the terminal Combin_n and the phase of the second transmit signal to be inputted into the terminal Combin_p become matched. The first transmit signal and the second transmit signal, which are matched in phase, are combined by the power combiner PC2, and the combined signal is outputted from the output terminal OTE2.

In FIG. 16, a capacitor element Cblk1 in the output matching circuit OMN(2n) is provided in order to cut off a DC component (a direct current component). For example, in FIG. 16, the last stage amplifier circuit SAMP(2p) is coupled to the preceding stage of the terminal OMNin_p (refer to FIG. 8), and a DC bias voltage is applied to a drain of an MISFET which configures the last stage amplifier circuit SAMP(2p). That is, the DC bias voltage is applied to the terminal OMNin_p coupled to the drain of the MISFET which configures the last stage amplifier circuit SAMP(2p). If the capacitor element Cblk1 is not provided, the terminal OMNin_p will be coupled to the ground, via the terminal Combin_p, the resistor element Rc, the terminal Combin_n, and the inductor element Lh1; accordingly, a direct current will flow between the terminal OMNin_p and the ground. For this reason, a direct current is prevented from flowing between the terminal OMNin_p and the ground by providing the capacitor element Cblk1 between the inductor element Lh1 and the ground. Similarly, a capacitor element Cblk2 coupled in series to the output terminal OTE2 possesses the function of cutting off a DC component (a direct current component).

In FIG. 16, the capacitor element Ct1 provided between the output terminal OTE2 and the ground possesses the trap function of flowing a higher harmonic to the ground. That is, in the power combiner PC2, a signal which has combined the first transmit signal and the second transmit signal is outputted from the output terminal OTE2, and higher harmonics with frequencies 2 times or 3 times the frequency of a signal to be transmitted primarily are included in the first transmit signal and the second transmit signal. Accordingly, in order to remove the higher harmonics before outputting them from the output terminal OTE2, the capacitor element Ct1 which functions as a harmonic trap filter is provided between the output terminal OTE2 and the ground. That is, since the capacitor element Ct1 can be considered to be short-circuited for a high frequency signal, by selecting the value of capacitance that can be considered to be short-circuited for higher harmonics with frequencies higher than the frequency of the signal to be transmitted primarily, it is possible to flow the higher harmonics with frequencies higher than the frequency of the signal to be transmitted primarily not to the output terminal OTE2 but to the ground. As a result, it is possible to reduce the higher harmonics outputted from the output terminal OTE2.

The output matching circuit OMN(2n), the output matching circuit OMN(2p), and the Webb-type power combiner PC2 in the present embodiment are configured as described above. The feature of the present embodiment is shown by the following. That is, the feature of the present embodiment is that two capacitor elements CisoA and CisoB are provided, coupled in parallel between the terminal Combin_n and the terminal Combin_p. That is, as illustrated in FIG. 15, when the isolation capacitor element is composed of one capacitor element Ciso and this capacitor element Ciso is formed not as a chip type component but as an interlayer capacitor element of the wiring substrate WB, the parasitic capacitance Cnn induced between the upper electrode UE1 which configures the capacitor element Ciso and the ground differs greatly from the parasitic capacitance Cpp induced between the lower electrode BE1 which configures the capacitor element Ciso and the ground. As a result, the phase balance of the first transmit signal and the second transmit signal which are inputted into the Webb-type power combiner PC2 is lost, and the loss of the electric power composition in the Webb-type power combiner PC2 becomes large.

Accordingly, in the present embodiment, the isolation capacitor element coupled between the terminal Combin_n and the terminal Combin_p is composed of two capacitor elements CisoA and CisoB which are coupled in parallel with each other. In this case, the value of capacitance of the parasitic capacitance Cn and the value of capacitance of the parasitic capacitance Cp as illustrated in FIG. 16 can be made almost equal, by enhancing the symmetry of the shape of the two capacitor elements CisoA and CisoB. As a result, it is possible to suppress degradation of the phase balance of the first transmit signal and the second transmit signal to be inputted into the Webb-type power combiner PC2, and it is possible to make small the loss of the electric power composition in the Webb-type power combiner PC2.

That is, the technical idea of the present embodiment has the feature that, by dividing the isolation capacitor element into two capacitor elements CisoA and CisoB with high symmetry and coupled in parallel, the parasitic capacitance arising from the capacitor element CisoA and the capacitor element CisoB can be made almost equal, even when the capacitor element CisoA and the capacitor element CisoB are formed as interlayer capacitor elements of the wiring substrate WB. In this way, the basic idea of the present embodiment is that, by composing the isolation capacitor element with two capacitor elements with high symmetry instead of one capacitor element, the value of capacitance of the parasitic capacitance Cn formed between the terminal Combin_n and the ground and the value of capacitance of the parasitic capacitance Cp formed between the terminal Combin_p and the ground are made equal. Accordingly, the present embodiment explains an example in which the isolation capacitor element is composed of two capacitor elements with high symmetry. The fundamental concept of the present embodiment can be extended also to a case where the isolation capacitor element is composed of even number of capacitor elements with high symmetry and coupled in parallel with each other. That is, also in a case where the isolation capacitor element is composed of even number of capacitor elements with high symmetry and coupled in parallel with each other, it is possible to make equal the value of capacitance of the parasitic capacitance Cn formed between the terminal Combin_n and the ground and the value of capacitance of the parasitic capacitance Cp formed between the terminal Combin_p and the ground. As a result, the following effect is obtained: that is, it is possible to suppress degradation of the phase balance of the first transmit signal and the second transmit signal to be inputted into the Webb-type power combiner PC2, and it is possible to make small the loss of the electric power composition in the Webb-type power combiner PC2.

In this way, the technical idea of the present embodiment can be applied to a case where the isolation capacitor element is composed of even number of capacitor elements with high symmetry and coupled in parallel. However, the present embodiment explains a configuration in which the isolation capacitor element is specifically divided into two capacitor elements CisoA and CisoB with high symmetry and coupled in parallel. That is, from a viewpoint of a layout configuration, the following explains that, by dividing the isolation capacitor element into two capacitor elements CisoA and CisoB with high symmetry and coupled in parallel, the value of capacitance of the parasitic capacitance Cn formed between the terminal Combin_n and the ground and the value of capacitance of the parasitic capacitance Cp formed between the terminal Combin_p and the ground can be made almost equal.

Feature of the Present Embodiment

Layout Configuration

Figure 17:
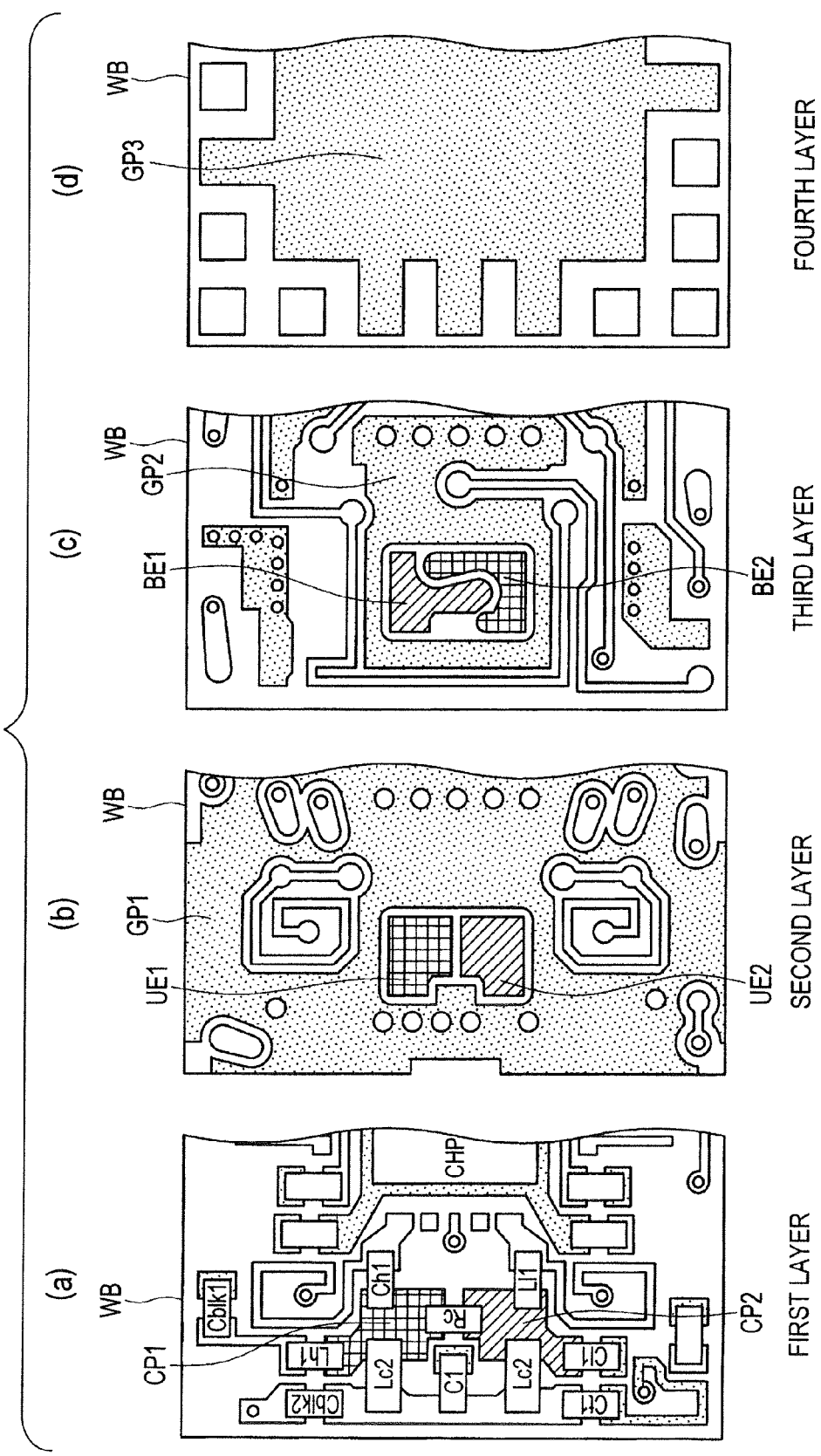
FIG. 17(a), FIG. 17(b), FIG. 17(c), and FIG. 17(d) are plan views respectively illustrating a partial area of each layer of a wiring substrate in which a PA module is formed in the embodiment.

FIG. 17(*a*), FIG. 17(*b*), FIG. 17(*c*), and FIG. 17(*d*) are plan views respectively illustrating a partial area of each layer of the wiring substrate WB in which a PA module is formed in the embodiment. The wiring substrate WB has a multilayer wiring structure, for example, a four-layer structure, each separated with an interlayer insulation film, as illustrated in FIGS. 17(*a*)-17(*d*). Specifically, as illustrated in FIG. 17(*a*), a semiconductor chip CHP and chip type components (passive components) are mounted in a first layer (surface) of the wiring substrate WB. A conductor pattern CP1 illustrated in FIG. 17(*a*) is a pattern having the same potential with the terminal Combin_n illustrated in FIG. 16, and a conductor pattern CP2 illustrated in FIG. 17(*a*) is a pattern having the same potential with the terminal Combin_p illustrated in FIG. 16.

Next, as illustrated in FIG. 17(*b*), a second layer is formed in the lower layer of the first layer of the wiring substrate WB. An upper electrode UE1 and an upper electrode UE2 are formed in the second layer. At this time, the upper electrode UE1 is electrically coupled to the conductor pattern CP1 illustrated in FIG. 17(*a*) via a plug (not shown), for example. That is, the upper electrode UE1 formed in the second layer of the wiring substrate WB has the same potential with the conductor pattern CP1 formed in the first layer of the wiring substrate WB. On the other hand, the upper electrode UE2 is electrically coupled to the conductor pattern CP2 illustrated in FIG. 17(*a*) via a plug (not shown), for example. That is, the upper electrode UE2 formed in the second layer of the wiring substrate WB has the same potential with the conductor pattern CP2 formed in the first layer of the wiring substrate WB. A ground pattern (a reference-potential conductor plane) GP1 is formed in the second layer so as to surround the circumference of the upper electrode UE1 and the upper electrode UE2.

Next, as illustrated in FIG. 17(*c*), a third layer is formed in the lower layer of the second layer of the wiring substrate WB. A lower electrode BE1 and a lower electrode BE2 are formed in the third layer. Here, the lower electrode BE1 is electrically coupled to the upper electrode UE2 illustrated in FIG. 17(*b*) via a plug (not shown), for example. That is, the lower electrode BE1 formed in the third layer of the wiring substrate WB has the same potential with the upper electrode UE2 formed in the second layer of the wiring substrate WB. Accordingly, the conductor pattern CP1 formed in the first layer of the wiring substrate WB, the upper electrode UE1 formed in the second layer, and the lower electrode BE2 formed in the third layer are electrically coupled with each other and have the same potential. The conductor pattern CP2 formed in the first layer of the wiring substrate WB, the upper electrode UE2 formed in the second layer, and the lower electrode BE1 formed in the third layer are electrically coupled with each other and have the same potential. A ground pattern GP2 is formed in the third layer so as to surround the circumference of the lower electrode BE1 and the lower electrode BE2.

Next, as illustrated in FIG. 17(*d*), a fourth layer is formed in the lower layer of the third layer of the wiring substrate WB. The fourth layer is the back of the wiring substrate WB. A ground pattern GP3 is formed in the fourth layer of the wiring substrate WB. In the wiring substrate WB with the four-layer structure configured in this way, the capacitor element CisoA illustrated in FIG. 16 is formed by the upper electrode UE1 formed in the second layer, the lower electrode BE1 formed in the third layer, and the interlayer insulation film (functioning as a capacity insulation film) sandwiched between the upper electrode UE1 and the lower electrode BE1. On the other hand, the capacitor element CisoB illustrated in FIG. 16 is formed by the upper electrode UE2 formed in the second layer, the lower electrode BE2 formed in the third layer, and the interlayer insulation film (functioning as a capacity insulation film) sandwiched between the upper electrode UE2 and the lower electrode BE2. In this way, it is possible to reduce the chip type components in number by forming the capacitor element CisoA and the capacitor element CisoB illustrated in FIG. 16 not as a chip type component but as an interlayer capacitor element of the wiring substrate WB.

Here, the feature of the layout configuration in the present embodiment is explained. First, as illustrated in FIG. 17(*b*), in the present embodiment, the symmetry of the upper electrode UE1 of the capacitor element CisoA and the upper electrode UE2 of the capacitor element CisoB is enhanced. Specifically, that the symmetry of the upper electrode UE1 and the upper electrode UE2 is enhanced means, in the present specification, a broad concept which includes not only a case where the symmetry exists between the upper electrode UE1 and the upper electrode UE2, but a case where it can be approximately considered that the symmetry exists between the upper electrode UE1 and the upper electrode UE2, even if the symmetry does not exist in the strict sense. For example, as illustrated in FIG. 17(*b*), it can be considered that the upper electrode UE1 and the upper electrode UE2 have a relation of mirror-image symmetry. In other words, it means that the area of the upper electrode UE1 and the area of the upper electrode UE2 are equal, and it also means that the shape of the upper electrode UE1 and the shape of the upper electrode UE2 are equal. The case where it can be approximately considered that the symmetry exists between the upper electrode UE1 and the upper electrode UE2, even if the symmetry does not exist in the strict sense, is a case as shown in the following example. That is, as illustrated in FIG. 17(*b*) and FIG. 17(*c*), the capacitor element CisoA has the upper electrode UE1 and the lower electrode BE1, and the capacitor element CisoB has the upper electrode UE2 and the lower electrode BE2. At this time, as clearly seen from FIG. 17(*b*) and FIG. 17(*c*), the difference in shape between the upper electrode UE1 and the upper electrode UE2 is smaller than the difference in shape between the upper electrode UE1 and the lower electrode BE1. In such a case, even if the symmetry does not exist between the upper electrode UE1 and the upper electrode UE2 in the strict sense, it is considered in the present specification that the symmetry between the upper electrode UE1 and the upper electrode UE2 is enhanced. That is, the case where the symmetry between the upper electrode UE1 and the upper electrode UE2 is enhanced by the present specification means a broad concept which includes not only a case where a distinct symmetry exists between the upper electrode UE1 and the upper electrode UE2, but also a case where the difference in shape between the upper electrode UE1 and the upper electrode UE2 is smaller than the difference in shape between the upper electrode UE1 and the lower electrode BE1 for example. At this time, that the difference in shape between the upper electrode UE1 and the upper electrode UE2 is smaller than the difference in shape between the upper electrode UE1 and the lower electrode BE1 can be rephrased such that the difference in area between the upper electrode UE1 and the upper electrode UE2 is smaller than the difference in area between the upper electrode UE1 and the lower electrode BE1. Furthermore, the case where the symmetry of the upper electrode UE1 and upper electrode UE2 is enhanced includes naturally a case where the symmetric relation existing between the upper electrode UE1 and the upper electrode UE2 is higher than the symmetric relation existing between the upper electrode UE1 and the lower electrode BE1.

Similarly, in the present embodiment, the symmetry of the lower electrode BE1 of the capacitor element CisoA and the lower electrode BE2 of the capacitor element CisoB is enhanced, as illustrated in FIG. 17(*c*). Specifically, that the symmetry of the lower electrode BE1 and the lower electrode BE2 is enhanced means, in the present specification, a broad concept which includes not only a case where the symmetry exists between the lower electrode BE1 and the lower electrode BE2, but a case where it can approximately considered that the symmetry exists between the lower electrode BE1 and the lower electrode BE2, even if the symmetry does not exist in the strict sense. For example, as illustrated in FIG. 17(*c*), it can be considered that the lower electrode BE1 and the lower electrode BE2 have a relation of a point symmetry for the most part. In other words, it means that the area of the lower electrode BE1 and the area of the lower electrode BE2 are nearly equal, and it also means that the shape of the lower electrode BE1 and the shape of the lower electrode BE2 are nearly equal. The case where it can be approximately considered that the symmetry exists between the lower electrode BE1 and the lower electrode BE2, even if the symmetry does not exist in the strict sense, is a case as shown in the following example. That is, as illustrated in FIG. 17(*b*) and FIG. 17(*c*), the capacitor element CisoA has the upper electrode UE1 and the lower electrode BE1, and the capacitor element CisoB has the upper electrode UE2 and the lower electrode BE2. At this time, as clearly seen from FIG. 17(*b*) and FIG. 17(*c*), the difference in shape between the lower electrode BE1 and the lower electrode BE2 is smaller than the difference in shape between the upper electrode UE1 and the lower electrode BE1. In such a case, even if the symmetry does not exist between the lower electrode BE1 and the lower electrode BE2 in the strict sense, it is considered in the present specification that the symmetry between the lower electrode BE1 and the lower electrode BE2 is enhanced. That is, the case where the symmetry between the lower electrode BE1 and the lower electrode BE2 is enhanced by the present specification means a broad concept which includes not only a case where a distinct symmetry exists between the lower electrode BE1 and the lower electrode BE2, but also a case where the difference in shape between the lower electrode BE1 and the lower electrode BE2 is smaller than the difference in shape between the upper electrode UE1 and the lower electrode BE1 for example. At this time, that the difference in shape between the lower electrode BE1 and the lower electrode BE2 is smaller than the difference in shape between the upper electrode UE1 and the lower electrode BE1 can be rephrased such that the difference in area between the lower electrode BE1 and the lower electrode BE2 is smaller than the difference in area of the upper electrode UE1 and the lower electrode BE1. Furthermore, the case where the symmetry of the lower electrode BE1 and the lower electrode BE2 is enhanced includes naturally a case where the symmetric relation existing between the lower electrode BE1 and the lower electrode BE2 is higher than the symmetric relation existing between the upper electrode UE1 and the lower electrode BE1.

In two capacitor elements CisoA and CisoB which are configured in this way, the symmetry of the upper electrode UE1 of the capacitor element CisoA and the upper electrode UE2 of the capacitor element CisoB is enhanced, and the symmetry of the lower electrode BE1 of the capacitor element CisoA and the lower electrode BE2 of the capacitor element CisoB is enhanced. The upper electrode UE1 which configures the capacitor element CisoA and the upper electrode UE2 which configures the capacitor element CisoB are formed in the second layer of the wiring substrate WB, and the lower electrode BE1 which configures the capacitor element CisoA and the lower electrode BE2 which configures the capacitor element CisoB are formed in the third layer of the wiring substrate WB. Accordingly, the distance between the upper electrode UE1 and the lower electrode BE1 which configure the capacitor element CisoA, and the distance between the upper electrode UE2 and the lower electrode BE2 which configure the capacitor element CisoB become equal. As a result, in the present embodiment, the value of capacitance of two capacitor elements CisoA and CisoB which configure the isolation capacitor element becomes nearly equal. That is, according to the present embodiment, the isolation capacitor element is formed by coupling in parallel the capacitor element CisoA and the capacitor element CisoB of a nearly equal value of capacitance, between the terminal Combin_n and the terminal Combin_p. In this case, the following explains that it is possible to make nearly equal the value of capacitance of the parasitic capacitance Cn formed between the terminal Combin_n and the ground and the value of capacitance of the parasitic capacitance Cp formed between the terminal Combin_p and the ground.

First, as illustrated in FIG. 17(b), the ground pattern GP1 is formed so as to surround the circumference of the upper electrodes UE1 and UE2 of which the symmetry is enhanced with each other. Also as illustrated in FIG. 17(c), the ground pattern GP2 is formed so as to surround the circumference of the lower electrodes BE1 and BE2 of which the symmetry is enhanced with each other. In addition, as illustrated in FIG. 17(d), the ground pattern GP3 is formed in the fourth layer as the lower layer of the third layer in which the lower electrodes BE1 and BE2 are formed.

Under such a configuration, the parasitic capacitance Cn formed between the terminal Combin_n and the ground is first considered. For example, the conductor pattern CP1 illustrated in FIG. 17(a) is at the same potential with the terminal Combin_n. Since the conductor pattern CP1 and the upper electrode UE1 illustrated in FIG. 17(b) are electrically coupled, the upper electrode UE1 and the terminal Combin_n are at the same potential. Therefore, it is proved that a part of the parasitic capacitance Cn is formed between the upper electrode UE1 and the ground pattern GP1 which is formed so as to surround the upper electrode UE1. Furthermore, for example, the upper electrode UE1 illustrated in FIG. 17(b) is at the same potential with the terminal Combin_n. Since the upper electrode UE1 and the lower electrode BE2 illustrated in FIG. 17(c) are electrically coupled, the lower electrode BE2 and the terminal Combin_n are at the same potential. Therefore, it is proved that a part of the parasitic capacitance Cn is formed also between the lower electrode BE2 and the ground pattern GP2 which is formed so as to surround the lower electrode BE2. Since the ground pattern GP3 is formed in the lower layer of the lower electrode BE2, it is proved that a part of the parasitic capacitance Cn is formed also between the lower electrode BE2 and the ground pattern GP3 which is formed in the lower layer of the lower electrode 8E2. As described above, the parasitic capacitance Cn formed between the terminal Combin_n and the ground is composed mainly of: (A1) the parasitic capacitance formed between the upper electrode UE1 and the ground pattern GP1 which is formed so as to surround the upper electrode UE1, (A2) the parasitic capacitance formed between the lower electrode BE2 and the ground pattern GP2 which is formed so as to surround the lower electrode BE2, and (A3) the parasitic capacitance formed between the lower electrode BE2 and the ground pattern GP3 which is formed in the lower layer of the lower electrode BE2.

Meanwhile, the parasitic capacitance Cp formed between the terminal Combin_p and the ground is considered. For example, the conductor pattern CP2 illustrated in FIG. 17(a) is at the same potential with the terminal Combin_p. Since the conductor pattern CP2 and the upper electrode UE2 illustrated in FIG. 17(b) are electrically coupled, the upper electrode UE2 and the terminal Combin_p are at the same potential. Therefore, it is proved that a part of the parasitic capacitance Cp is formed between the upper electrode UE2 and the ground pattern GP1 which is formed so as to surround the upper electrode UE2. Furthermore, for example, the upper electrode UE2 illustrated in FIG. 17(b) is at the same potential with the terminal Combin_p. Since the upper electrode UE2 and the lower electrode BE1 illustrated in FIG. 17(c) are electrically coupled, the lower electrode BE1 and the terminal Combin_p are at the same potential. Therefore, it is proved that a part of the parasitic capacitance Cp is formed also between the lower electrode BE1 and the ground pattern GP2 which is formed so as to surround the lower electrode BE1. Since the ground pattern GP3 is formed in the lower layer of the lower electrode BE1, it is proved that a part of the parasitic capacitance Cp is formed also between the lower electrode BE1 and the ground pattern GP3 which is formed in the lower layer of the lower electrode BE1. As described above, the parasitic capacitance Cp formed between the terminal Combin_p and the ground is composed mainly of: (B1) the parasitic capacitance formed between the upper electrode UE2 and the ground pattern GP1 which is formed so as to surround the upper electrode UE2, (B2) the parasitic capacitance formed between the lower electrode BE1 and the ground pattern GP2 which is formed so as to surround the lower electrode BE1, and (B3) the parasitic capacitance formed between the lower electrode BE1 and the ground pattern GP3 which is formed in the lower layer of the lower electrode BE1.

From the above description, it is proved that the parasitic capacitance Cn is composed mainly of (A1)+(A2)+(A3), and that the parasitic capacitance Cp is composed mainly of (B1)+(B2)+(B3). When (A1) composing apart of the parasitic capacitance Cn and (B1) composing a part of the parasitic capacitance Cp are compared, the relation that (A1)≈(B1) is considered to hold, because the symmetry of the upper electrode UE1 and the upper electrode UE2 is enhanced and the ground pattern GP1 is formed so as to surround the circumference of the upper electrode UE1 and the upper electrode UE2. When (A2) composing a part of the parasitic capacitance Cn and (B2) composing a part of the parasitic capacitance Cp are compared, the relation that (A2)≈(B2) is considered to hold, because the symmetry of the lower electrode BE1 and the lower electrode BE2 is enhanced and the ground pattern GP2 is formed so as to surround the circumference of the lower electrode BE1 and the lower electrode BE2. Furthermore, when (A3) composing a part of the parasitic capacitance Cn and (B3) composing a part of the parasitic capacitance Cp are compared, the relation that (A3)≈(B3) is considered to hold, because the symmetry of the lower electrode BE1 and the lower electrode BE2 is enhanced, and because the ground pattern GP3 is formed in the lower layer of the lower electrode BE1 and the lower electrode BE2, and the distance between the lower electrode BE1 and the ground pattern GP3 and the distance between the lower electrode BE2 and the ground pattern GP3 are equal. Accordingly, the value of capacitance of the parasitic capacitance Cn which is composed mainly of (A1)+(A2)+(A3), and the value of capacitance of the parasitic capacitance Cp which is composed mainly of (B1)+(B2)+(B3) become nearly equal. As a result, it is possible to suppress degradation of the phase balance of the first transmit signal and the second transmit signal to be inputted into the Webb-type power combiner PC2, and it is possible to make small the loss of the electric power composition in the Webb-type power combiner PC2.

<<A Layout Configuration in a Modified Example>>

Figure 18:
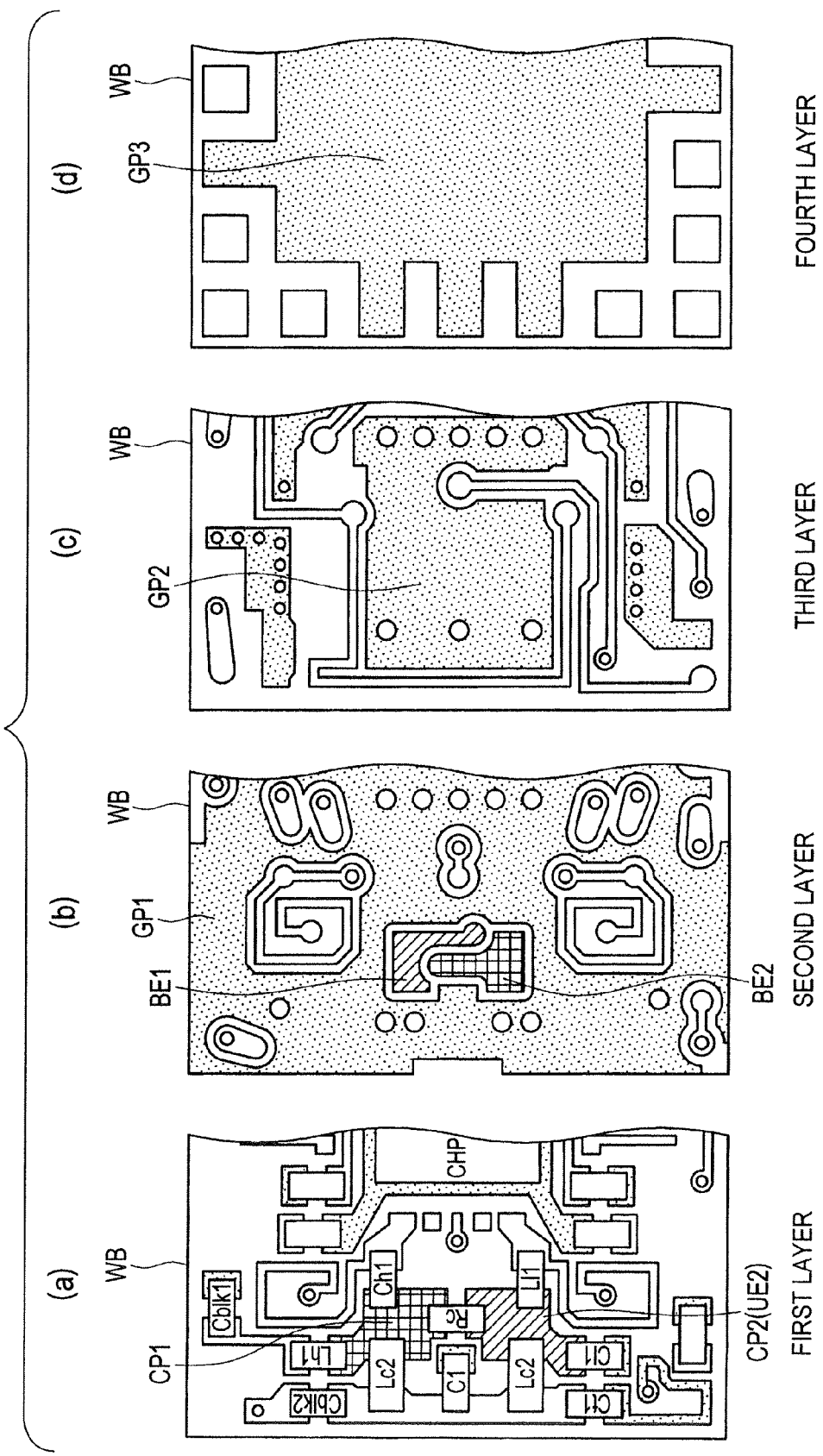
FIG. 18(a), FIG. 18(b), FIG. 18(c), and FIG. 18(d) are plan views respectively illustrating a partial area of each layer of a wiring substrate in which a PA module is formed in a modified example.

Next, a layout configuration in a modified example is explained. FIG. 18(a), FIG. 18(b), FIG. 18(c), and FIG. 18(d) are plan views respectively illustrating a partial area of each layer of the wiring substrate WB in which a PA module is formed in the modified example. The wiring substrate WB has a multilayer wiring structure, for example, a four-layer structure, each separated with an interlayer insulation film, as illustrated in FIGS. 18(a)-18(d). Specifically, as illustrated in FIG. 18(a), a semiconductor chip CHP and chip type components (passive components) are mounted in a first layer (surface) of the wiring substrate WB. A conductor pattern CP1 illustrated in FIG. 18(a) is a pattern having the same potential with the terminal Combin_n illustrated in FIG. 16, and a conductor pattern CP2 illustrated in FIG. 18(a) is a pattern having the same potential with the terminal Combin_p illustrated in FIG. 16. In the present modified example, the conductor pattern CP1 serves as the upper electrode UE1 of the capacitor element CisoA, and the conductor pattern CP2 serves as the upper electrode UE2 of the capacitor element CisoB.

Next, as illustrated in FIG. 18(b), a second layer is formed in the lower layer of the first layer of the wiring substrate WB, and a lower electrode BE1 and a lower electrode BE2 are formed in the second layer. At this time, the lower electrode BE1 is electrically coupled to the conductor pattern CP2 (the upper electrode UE2) illustrated in FIG. 18(a) via a plug (not shown), for example. That is, the lower electrode BE1 formed in the second layer of the wiring substrate WB has the same potential with the conductor pattern CP2 (the upper electrode UE2) formed in the first layer of the wiring substrate WB. On the other hand, the lower electrode BE2 is electrically coupled to the conductor pattern CP1 (the upper electrode UE1) illustrated in FIG. 18(a) via a plug (not shown), for example. That is, the lower electrode BE2 formed in the second layer of the wiring substrate WB has the same potential with the conductor pattern CP1 (the upper electrode UE1) formed in the first layer of the wiring substrate WB. A ground pattern (a reference-potential conductor plane) GP1 is formed in the second layer so as to surround the circumference of the lower electrode BE1 and the lower electrode BE2.

Next, as illustrated in FIG. 18(c), a third layer is formed in the lower layer of the second layer of the wiring substrate WB, and a ground pattern GP2 is formed in the third layer. Next, as illustrated in FIG. 18(d), a fourth layer is formed in the lower layer of the third layer of the wiring substrate WB. The fourth layer is the back of the wiring substrate WB. A ground pattern GP3 is formed in the fourth layer of the wiring substrate WB. In the wiring substrate WB with the four-layer structure configured in this way, the capacitor element CisoA illustrated in FIG. 16 is formed with the upper electrode UE1 formed in the first layer (the conductor pattern CP1), the lower electrode BE1 formed in the second layer, and the interlayer insulation film (functioning as a capacity insulation film) sandwiched between the upper electrode UE1 (the conductor pattern CP1) and the lower electrode BE1. On the other hand, the capacitor element CisoB illustrated in FIG. 16 is formed by the upper electrode UE2 formed in the first layer (the conductor pattern CP2), the lower electrode BE2 formed in the second layer, and the interlayer insulation film (functioning as a capacity insulation film) sandwiched between the upper electrode UE2 (the conductor pattern CP2) and the lower electrode BE2. In this way, it is possible to reduce the chip type components in number by forming the capacitor element CisoA and the capacitor element CisoB illustrated in FIG. 16 not as a chip type component but as an interlayer capacitor element of the wiring substrate WB.

Here, as illustrated in FIG. 18(a), in the present modified example, the symmetry of the upper electrode UE1 of the capacitor element CisoA and the upper electrode UE2 of the capacitor element CisoB is enhanced. Specifically, that the symmetry of the upper electrode UE1 and the upper electrode UE2 is enhanced means, in the present specification, a broad concept which includes not only a case where the symmetry between the upper electrode UE1 and the upper electrode UE2 exists, but a case where it can be approximately considered that the symmetry exists between the upper electrode UE1 and the upper electrode UE2, even if the symmetry does not exist in the strict sense. For example, as illustrated in FIG. 18(a), it can be considered that the upper electrode UE1 and the upper electrode UE2 have a relation of mirror-image symmetry. In other words, it means that the area of the upper electrode UE1 and the area of the upper electrode UE2 are equal, and it also means that the shape of the upper electrode UE1 and the shape of the upper electrode UE2 are equal. The case where it can be approximately considered that the symmetry exists between the upper electrode UE1 and the upper electrode UE2, even if the symmetry does not exist in the strict sense, is a case as shown in the following example. That is, as illustrated in FIG. 18(a) and FIG. 18(b), the capacitor element CisoA has the upper electrode UE1 and the lower electrode BE1, and the capacitor element CisoB has the upper electrode UE2 and the lower electrode BE2. At this time, as clearly seen from FIG. 18(a) and FIG. 18(b), the difference in shape between the upper electrode UE1 and the upper electrode UE2 is smaller than the difference in shape between the upper electrode UE1 and the lower electrode BE1. In such a case, even if the symmetry does not exist between the upper electrode UE1 and the upper electrode UE2 in the strict sense, it is considered in the present specification that the symmetry between the upper electrode UE1 and the upper electrode UE2 is enhanced. That is, the case where the symmetry between the upper electrode UE1 and the upper electrode UE2 is enhanced by the present specification means a broad concept which includes not only a case where a distinct symmetry exists between the upper electrode UE1 and the upper electrode UE2, but also a case where the difference in shape between the upper electrode UE1 and the upper electrode UE2 is smaller than the difference in shape between the upper electrode UE1 and the lower electrode BE1 for example. At this time, that the difference in shape between the upper electrode UE1 and the upper electrode UE2 is smaller than the difference in shape between the upper electrode UE1 and the lower electrode BE1 can be rephrased such that the difference in area between the upper electrode UE1 and the upper electrode UE2 is smaller than the difference in area between the upper electrode UE1 and the lower electrode BE1. Furthermore, the case where the symmetry of the upper electrode UE1 and the upper electrode UE2 is enhanced includes naturally a case where the symmetric relation existing between the upper electrode UE1 and the upper electrode UE2 is higher than the symmetric relation existing between the upper electrode UE1 and the lower electrode BE1.

Similarly, in the present modified example, the symmetry of the lower electrode BE1 of the capacitor element CisoA and the lower electrode BE2 of the capacitor element CisoB is enhanced, as illustrated in FIG. 18(b). Specifically, that the symmetry of the lower electrode BE1 and the lower electrode BE2 is enhanced means, in the present specification, a broad concept which includes not only a case where the symmetry between the lower electrode BE1 and the lower electrode BE2 exists, but a case where it can approximately considered that the symmetry exists between the lower electrode BE1 and the lower electrode BE2, even if the symmetry does not exist in the strict sense. For example, as illustrated in FIG. 18(b), it can be considered that the lower electrode BE1 and the lower electrode BE2 have a relation of a point symmetry for the most part. In other words, it means that the area of the lower electrode BE1 and the area of the lower electrode BE2 are nearly equal, and it also means that the shape of the lower electrode BE1 and the shape of the lower electrode BE2 are nearly equal. The case where it can be approximately considered that the symmetry exists between the lower electrode BE1 and the lower electrode BE2, even if the symmetry does not exist in the strict sense, is a case as shown in the following example. That is, as illustrated in FIG. 18(a) and FIG. 18(b), the capacitor element CisoA has the upper electrode UE1 and the lower electrode BE1, and the capacitor element CisoB has the upper electrode UE2 and the lower electrode BE2. At this time, as clearly seen from FIG. 18(a) and FIG. 18(b), the difference in shape between the lower electrode BE1 and the lower electrode BE2 is smaller than the difference in shape between the upper electrode UE1 and the lower electrode BE1. In such a case, even if the symmetry does not exist between the lower electrode BE1 and the lower electrode BE2 in the strict sense, it is considered in the present specification that the symmetry between the lower electrode BE1 and the lower electrode BE2 is enhanced. That is, the case where the symmetry between the lower electrode BE1 and the lower electrode BE2 is enhanced by the present specification means a broad concept which includes not only a case where a distinct symmetry exists between the lower electrode BE1 and the lower electrode BE2, but also a case where the difference in shape between the lower electrode BE1 and the lower electrode BE2 is smaller than the difference in shape between the upper electrode UE1 and the lower electrode BE1 for example. At this time, that the difference in shape between the lower electrode BE1 and the lower electrode BE2 is smaller than the difference in shape between the upper electrode UE1 and the lower electrode BE1 can be rephrased such that the difference in area between the lower electrode BE1 and the lower electrode BE2 is smaller than the difference in area of the upper electrode UE1 and the lower electrode BE1. Furthermore, the case where the symmetry of the lower electrode BE1 and the lower electrode BE2 is enhanced includes naturally a case where the symmetric relation existing between the lower electrode BE1 and the lower electrode BE2 is higher than the symmetric relation existing between the upper electrode UE1 and the lower electrode BE1.

In two capacitor elements CisoA and CisoB which are composed in this way, the symmetry of the upper electrode UE1 of the capacitor element CisoA and the upper electrode UE2 of the capacitor element CisoB is enhanced, and the symmetry of the lower electrode BE1 of the capacitor element CisoA and the lower electrode BE2 of the capacitor element CisoB is enhanced. The upper electrode UE1 which configures the capacitor element CisoA, and the upper electrode UE2 which configure the capacitor element CisoB are formed in the first layer of the wiring substrate WB. The lower electrode BE1 which configures the capacitor element CisoA, and the lower electrode BE2 which configures the capacitor element CisoB are formed in the second layer of the wiring substrate WB. Accordingly, the distance between the upper electrode UE1 and the lower electrode BE1 which configure the capacitor element CisoA, and the distance between the upper electrode UE2 and the lower electrode BE2 which configure the capacitor element CisoB become equal. As a result, in the present modified example, the value of capacitance of two capacitor elements CisoA and CisoB which configure the isolation capacitor element becomes nearly equal. That is, according to the present modified example, the isolation capacitor element is formed by coupling in parallel the capacitor element CisoA and the capacitor element CisoB of a nearly equal value of capacitance, between the terminal Combin_n and the terminal Combin_p. In this case, the following explains that it is possible to make nearly equal the value of capacitance of the parasitic capacitance Cn formed between the terminal Combin_n and the ground and the value of capacitance of the parasitic capacitance Cp formed between the terminal Combin_p and the ground.

First, as illustrated in FIG. 18(b), the ground pattern GP1 is formed so as to surround the circumference of the lower electrodes BE1 and BE2 of which the symmetry is enhanced with each other. As illustrated in FIGS. 18(c) and 18(d), the ground pattern GP2 is formed in the third layer as the lower layer of the second layer in which the lower electrode BE1 and the lower electrode BE2 are formed, and the ground pattern GP3 is formed in the fourth layer as the lower layer of the third layer.

Under such a configuration, the parasitic capacitance Cn formed between the terminal Combin_n and the ground is first considered. For example, the upper electrode UE1 illustrated in FIG. 18(a) is at the same potential with the terminal Combin_n. Since the upper electrode UE1 and the lower electrode BE2 illustrated in FIG. 18(b) are electrically coupled, the lower electrode BE2 and the terminal Combin_n are at the same potential. Therefore, it is proved that a part of the parasitic capacitance Cn is formed also between the lower electrode BE2 and the ground pattern GP1 which is formed so as to surround the lower electrode BE2. Since the ground pattern GP2 is formed in the lower layer of the lower electrode BE2, it is proved that a part of the parasitic capacitance Cn is formed also between the lower electrode BE2 and the ground pattern GP2 which is formed in the lower layer of the lower electrode BE2. Although the ground pattern GP3 is formed in the lower layer of the ground pattern GP2, the distance between the lower electrode BE2 and the ground pattern GP3 is larger than the distance between the lower electrode BE2 and the ground pattern GP2; accordingly, the parasitic capacitance is small and is not taken into consideration here. As described above, the parasitic capacitance Cn formed between the terminal Combin_n and the ground is composed mainly of: (A1) the parasitic capacitance formed between the lower electrode BE2 and the ground pattern GP1 which is formed so as to surround the lower electrode BE2, and (A2) the parasitic capacitance formed between the lower electrode BE2 and the ground pattern GP2 which is formed in the lower layer of the lower electrode BE2.

Meanwhile, the parasitic capacitance Cp formed between the terminal Combin_p and the ground is considered. For example, the upper electrode UE2 illustrated in FIG. 18(a) is at the same potential with the terminal Combin_p. Since the upper electrode UE2 and the lower electrode BE1 illustrated in FIG. 18(b) are electrically coupled, the lower electrode BE1 and the terminal Combin_p are at the same potential. Therefore, it is proved that a part of the parasitic capacitance Cp is formed also between the lower electrode BE1 and the ground pattern GP1 which is formed so as to surround the lower electrode BE1. Since the ground pattern GP2 is formed in the lower layer of the lower electrode BE1, it is proved that a part of the parasitic capacitance Cp is formed also between the lower electrode BE1 and the ground pattern GP2 which is formed in the lower layer of the lower electrode BE1. As described above, the parasitic capacitance Cp formed between the terminal Combin_p and the ground is composed mainly of: (B1) the parasitic capacitance formed between the lower electrode BE1 and the ground pattern GP1 which is formed so as to surround the lower electrode BE1, and (B2) the parasitic capacitance formed between the lower electrode BE1 and the ground pattern GP2 which is formed in the lower layer of the lower electrode BE1.

From the above description, it is proved that the parasitic capacitance Cn is composed mainly of (A1)+(A2), and that the parasitic capacitance Cp is composed mainly of (B1)+ (B2). When (A1) composing a part of the parasitic capacitance Cn and (B1) composing a part of the parasitic capacitance Cp are compared, the relation that (A1)≈(B1) is considered to hold, because the symmetry of the lower electrode BE1 and the lower electrode BE2 is enhanced and the ground pattern GP1 is formed so as to surround the circumference of the lower electrode BE1 and the lower electrode BE2. When (A2) composing a part of the parasitic capacitance Cn and (B2) composing a part of the parasitic capacitance Cp are compared, the relation that (A2)≈(B2) is considered to hold, because the symmetry of the lower electrode BE1 and the lower electrode BE2 is enhanced, and because the ground pattern GP2 is formed in the lower layer of the lower electrode BE1 and the lower electrode BE2, and the distance between the lower electrode BE1 and the ground pattern GP2 and the distance between the lower electrode BE2 and the ground pattern GP2 are equal. Accordingly, the value of capacitance of the parasitic capacitance Cn which is composed mainly of (A1)+(A2), and the value of capacitance of the parasitic capacitance Cp which is composed mainly of (B1)+(B2) become nearly equal. As a result, also in the present modified example, as is the case with the embodiment, it is possible to suppress degradation of the phase balance of the first transmit signal and the second transmit signal to be inputted into the Webb-type power combiner PC2, and it is possible to make small the loss of the electric power composition in the Webb-type power combiner PC2.

In particular, in the present modified example, the conductor pattern CP1 formed in the first layer of the wiring substrate WB serves as the upper electrode UE1, and the conductor pattern CP2 formed in the first layer of the wiring substrate WB serves as the upper electrode UE2. Therefore, patterning of each layer of the wiring substrate WB of the four-layer structure can be simplified compared with the embodiment. Therefore, further reduction in cost of the PA module can also be attained.

Effect in the Present Embodiment

According to the technical idea of the present embodiment, by composing the isolation capacitor element with even number of capacitor elements with high symmetry and coupled in parallel, it is possible to make equal the value of capacitance of the parasitic capacitance Cn formed between the terminal Combin_n and the ground and the value of capacitance of the parasitic capacitance Cp formed between the terminal Combin_p and the ground. As a result, the following effect is obtained: that is, it is possible to suppress degradation of the phase balance of the first transmit signal and the second transmit signal to be inputted into the Webb-type power combiner PC2, and it is possible to make small the loss of the electric power composition in the Webb-type power combiner PC2.

Figure 19:
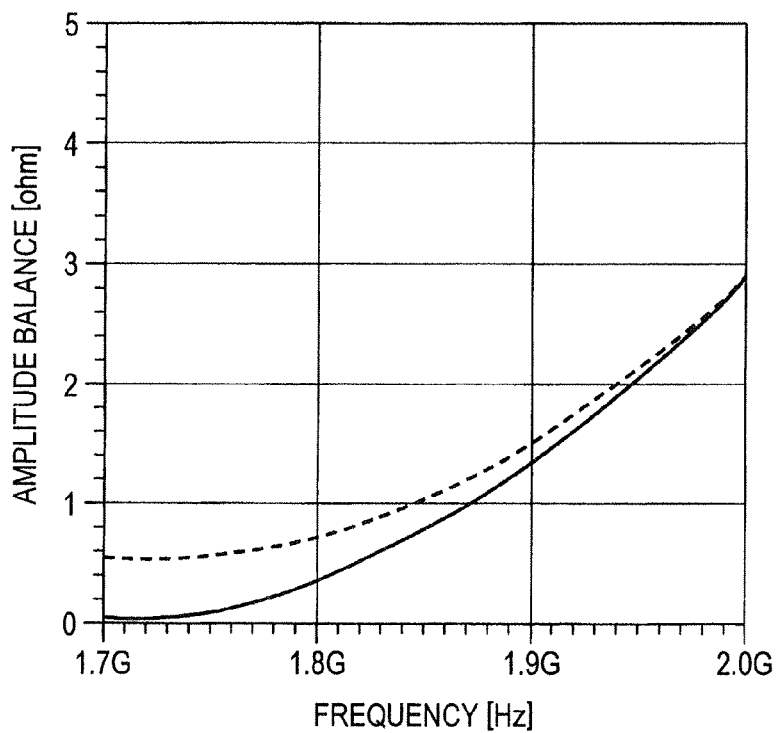
FIG. 19 is a graph illustrating a relation between amplitude balance and a carrier frequency in a balanced amplifier to which the technical idea of the embodiment is applied and in a balanced amplifier according to previously existing technology.

Usefulness of the technical idea of the present embodiment is explained specifically, referring to graphs. FIG. 19 is a graph illustrating a relation between amplitude balance and a carrier frequency, in a balanced amplifier to which the technical idea of the embodiment is applied, and in a balanced amplifier according to previously existing technology. In FIG. 19, the horizontal axis shows the carrier frequency (Hz) and the vertical axis shows the amplitude balance. Here, the solid line shows the balanced amplifier according to the previously existing technology, and the dashed line shows the balanced amplifier in the present embodiment. As illustrated in FIG. 19, in the region of the target carrier frequency (1.92 GHz-1.98 GHz), it is seen that the amplitude balance of the balanced amplifier according to the previously existing technology and that of the balanced amplifier of the present embodiment are equivalent.

Figure 20:
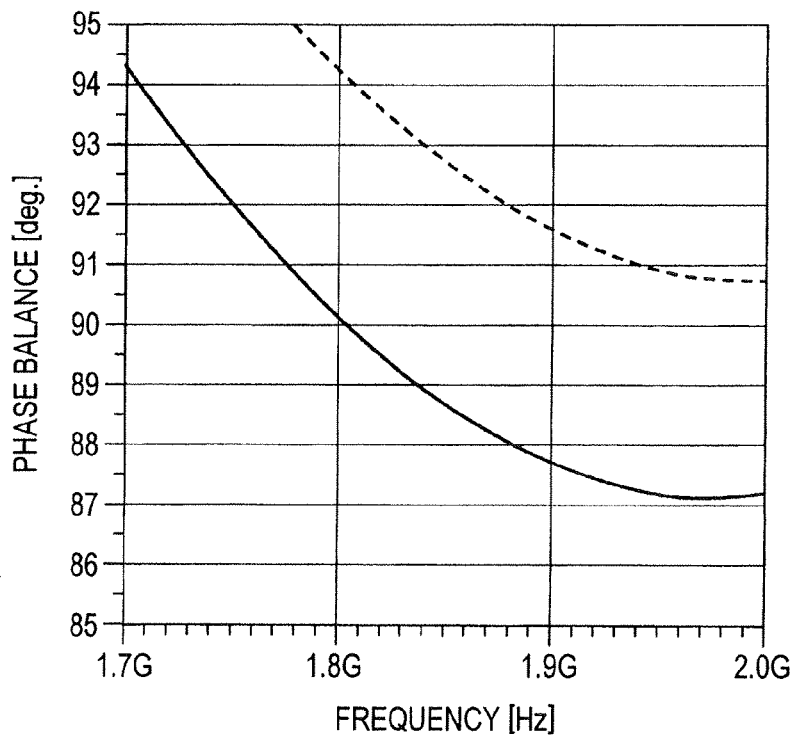
FIG. 20 is a graph illustrating a relation between phase balance and a carrier frequency in the balanced amplifier to which the technical idea of the embodiment is applied and in the balanced amplifier according to the previously existing technology.

Next, FIG. 20 is a graph illustrating a relation between phase balance and a carrier frequency, in the balanced amplifier to which the technical idea of the embodiment is applied, and in the balanced amplifier according to the previously existing technology. In FIG. 20, the horizontal axis shows the carrier frequency (Hz) and the vertical axis shows the phase balance. Here, the solid line shows the balanced amplifier according to the previously existing technology, and the dashed line shows the balanced amplifier in the present embodiment. As shown in FIG. 20, in the region of the target carrier frequency (1.92 GHz-1.98 GHz), the balanced amplifier of the present embodiment exhibits the phase balance of about 90.8 degrees, in contrast to the phase balance of about 87 degrees exhibited by the balanced amplifier according to the previously existing technology. That is, it is seen from FIG. 20 that, according to the balanced amplifier of the present embodiment, it is possible to suppress the degradation of the phase balance due to the difference in capacity of the parasitic capacitance, as the result that the value of capacitance of the parasitic capacitance which exists in the negative path and the value of capacitance of the parasitic capacitance which exists in the positive path are made nearly equal.

Figure 21:
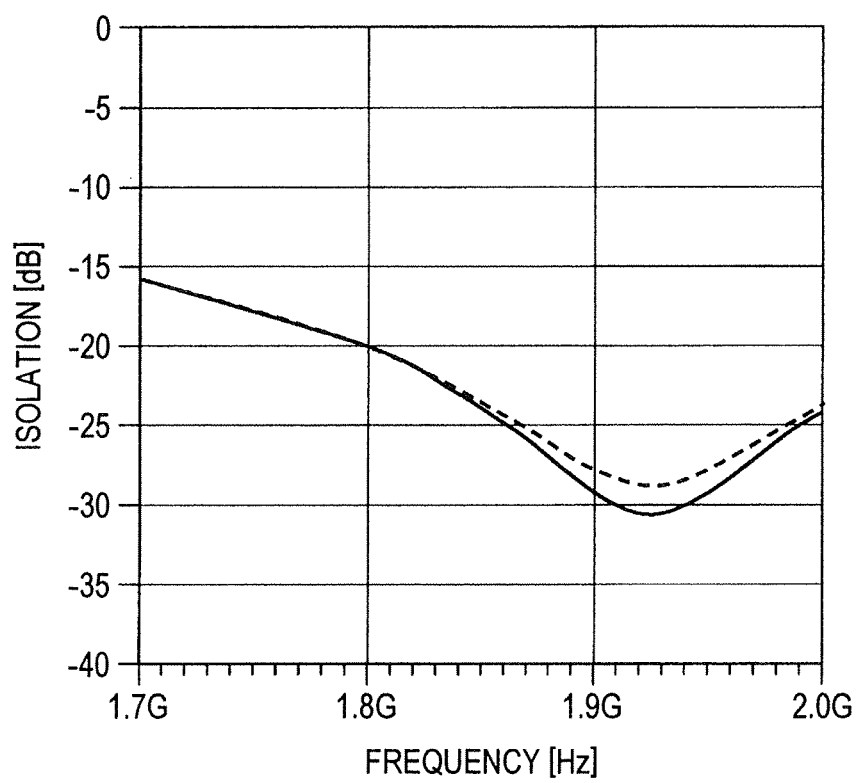
FIG. 21 is a graph illustrating a relation between isolation and a carrier frequency in the balanced amplifier to which the technical idea of the embodiment is applied and in the balanced amplifier according to the previously existing technology.

FIG. 21 is a graph illustrating a relation between isolation and a carrier frequency, in the balanced amplifier to which the technical idea of the embodiment is applied, and in the balanced amplifier according to the previously existing technology. In FIG. 21, the horizontal axis shows the carrier frequency (Hz) and the vertical axis shows isolation. Here, the solid line shows a relation for the balanced amplifier according to the previously existing technology, and the dashed line shows a relation for the balanced amplifier in the present embodiment. As shown in FIG. 21, in the region of the target carrier frequency (1.92 GHz-1.98 GHz) it is proved that the isolation of the balanced amplifier according to the previously existing technology and that of the balanced amplifier of the present embodiment are equivalent.

As describe above, according to the balanced amplifier to which the technical idea of the present embodiment is applied, it is seen that the phase balance superior to that of the balanced amplifier according to the previously existing technology can be obtained, while obtaining the amplitude balance and isolation equivalent to those of the balanced amplifier according to the previously existing technology.

As described above, the invention accomplished by the present inventors has been concretely explained based on the embodiment. However, it cannot be overemphasized that the present invention is not restricted to the embodiment, and it can be changed variously in the range which does not deviate from the gist.

The present invention can be broadly utilized for the manufacturing industry which manufactures a semiconductor device.

What is claimed is:
1. A semiconductor device comprising:
a negative path;
a positive path: and
a power combiner,
the negative path including:
(a1) a first phase shifter;
(b1) a first amplifier coupled to an output of the first phase shifter;
(c1) a second phase shifter coupled to an output of the first amplifier, and
(d1) a first terminal;

the positive path including:

(a2) a third phase shifter;

(b2) a second amplifier coupled to an output of the third phase shifter;

(c2) a fourth phase shifter coupled to an output of the second amplifier, and (d2) a second terminal;

the power combiner being operable to combine a first signal output from the second phase shifter via the first terminal, and a second signal output from the fourth phase shifter via the second terminal and having a same phase as the first signal, wherein the power combiner is a Webb-type power combiner, and wherein the Webb-type power combiner comprises:

a resistor element provided between the negative path and the positive path; and an even number of capacitor elements coupled in parallel, each of the capacitor elements being coupled between the first terminal of the negative path and the second terminal of the positive path.

2. The semiconductor device according to claim 1, wherein the even number of capacitor elements comprise a first capacitor element and a second capacitor element.

3. The semiconductor device according to claim 2, wherein the first capacitor element comprises a first upper electrode formed in a first layer of a multilayer wiring board, a first lower electrode formed in a second layer disposed lower than the first layer of the multilayer wiring board, and a capacity insulating layer sandwiched between the first layer and the second layer, and wherein the second capacitor element comprises a second upper electrode formed in the first layer of the multilayer wiring board, a second lower electrode formed in the second layer of the multilayer wiring board, and the capacity insulating layer.

4. The semiconductor device according to claim 3, wherein the value of capacitance of the first capacitor element and the value of capacitance of the second capacitor element are substantially equal.

5. The semiconductor device according to claim 3, wherein the difference in area of the first lower electrode and the second lower electrode is smaller than the difference in area of the first upper electrode and the first lower electrode.

6. The semiconductor device according to claim 5, wherein the area of the first lower electrode and the area of the second lower electrode are substantially equal.

7. The semiconductor device according to claim 3, wherein the difference in shape of the first lower electrode and the second lower electrode is smaller than the difference in shape of the first upper electrode and the first lower electrode.

8. The semiconductor device according to claim 7, wherein the shape of the first lower electrode and the shape of the second lower electrode are substantially equal.

9. The semiconductor device according to claim 3, wherein the symmetric relation existing between the shape of the first lower electrode and the shape of the second lower electrode is higher than the symmetric relation existing between the shape of the first upper electrode and the shape of the first lower electrode.

10. The semiconductor device according to claim 3, wherein the difference in area of the first upper electrode and the second upper electrode is smaller than the difference in area of the first upper electrode and the first lower electrode.

11. The semiconductor device according to claim 10, wherein the area of the first upper electrode and the area of the second upper electrode are substantially equal.

12. The semiconductor device according to claim 3, wherein the difference in shape of the first upper electrode and the second upper electrode is smaller than the difference in shape of the first upper electrode and the first lower electrode.

13. The semiconductor device according to claim 3, wherein the symmetric relation existing between the shape of the first upper electrode and the shape of the second upper electrode is higher than the symmetric relation existing between the shape of the first upper electrode and the shape of the first lower electrode.

14. The semiconductor device according to claim 13, wherein the first upper electrode and the second upper electrode satisfy the relation of mirror-image symmetry.

15. The semiconductor device according to claim 3, wherein the distance between the first upper electrode and the first lower electrode and the distance between the second upper electrode and the second lower electrode are substantially equal.

16. The semiconductor device according to claim 3, wherein the potential of the first upper electrode and the potential of the second lower electrode are equipotential, and the Potential of the second upper electrode and the potential of the first lower electrode are equipotential.

17. The semiconductor device according to claim 3, wherein a reference-potential conductor plane to which reference potential is applied is formed in a third layer disposed lower than the second layer of the multilayer wiring board.

18. The semiconductor device according to claim 17, wherein the difference in area of the first lower electrode and the second lower electrode is smaller than the difference in area of the first upper electrode and the first lower electrode, and the distance between the first lower electrode and the reference-potential conductor plane and the distance between the second lower electrode and the reference-potential conductor plane are substantially equal.

* * * * *